US 6,563,594 B2

(12) United States Patent
Mikami

(10) Patent No.: US 6,563,594 B2
(45) Date of Patent: May 13, 2003

(54) MARK POSITION DETECTING SYSTEM AND METHOD FOR DETECTING MARK POSITION

(75) Inventor: Toru Mikami, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 129 days.

(21) Appl. No.: 09/816,111

(22) Filed: Mar. 26, 2001

(65) Prior Publication Data

US 2001/0026368 A1 Oct. 4, 2001

(30) Foreign Application Priority Data

Mar. 27, 2000 (JP) ........................................ 2000-086908

(51) Int. Cl.$^7$ ............................................... G01D 11/14
(52) U.S. Cl. ..................... 356/614; 356/620; 250/559.3
(58) Field of Search ................................ 356/620, 614, 356/121, 601, 400, 401; 421/30; 250/559.29, 559.3, 559.4, 559.44, 559.33, 221

(56) References Cited

U.S. PATENT DOCUMENTS

| | | | | |
|---|---|---|---|---|
| 4,642,468 A | * | 2/1987 | Tabata et al. | ................ 250/548 |
| 4,808,829 A | * | 2/1989 | Okumura et al. | ............ 250/310 |
| 5,392,361 A | * | 2/1995 | Imaizumi et al. | ............ 382/260 |
| 5,877,505 A | * | 3/1999 | Fujino | ...................... 250/491.1 |
| 5,943,638 A | * | 8/1999 | Aoyagi | ........................ 382/151 |

FOREIGN PATENT DOCUMENTS

| | | | | |
|---|---|---|---|---|
| JP | 6-258045 | | 9/1994 | |
| JP | 11145028 A | * | 5/1999 | ......... H01L/21/027 |
| JP | 2001085300 A | * | 3/2001 | ......... H01L/21/027 |
| JP | 2001284232 A | * | 10/2001 | ......... H01L/21/027 |

* cited by examiner

Primary Examiner—Michael G. Lee
Assistant Examiner—Uyen-Chau Le
(74) Attorney, Agent, or Firm—Finnegan, Henderson, Farabow, Garrett & Dunner, L.L.P.

(57) ABSTRACT

A mark position detecting system includes a light source for illuminating light on a mark for alignment measurement formed on a semiconductor substrate, a light detecting optical system and a measured light intensity profile preparing part, a theoretical light intensity profile preparing part, a light intensity profile comparison part. The measured light intensity profile preparation part prepares a measured light intensity profile denoting light intensity of reflected light from the mark from a detection result by the detecting optical system. The theoretical light intensity profile preparing part prepares a theoretical light intensity profile of the reflected light from a region of the mark where the intensity would change, using information on the shape and material of the mark. The light intensity profile comparison part compares the theoretical light intensity profile with the measured light intensity profile to detect the mark and misalignment.

12 Claims, 22 Drawing Sheets

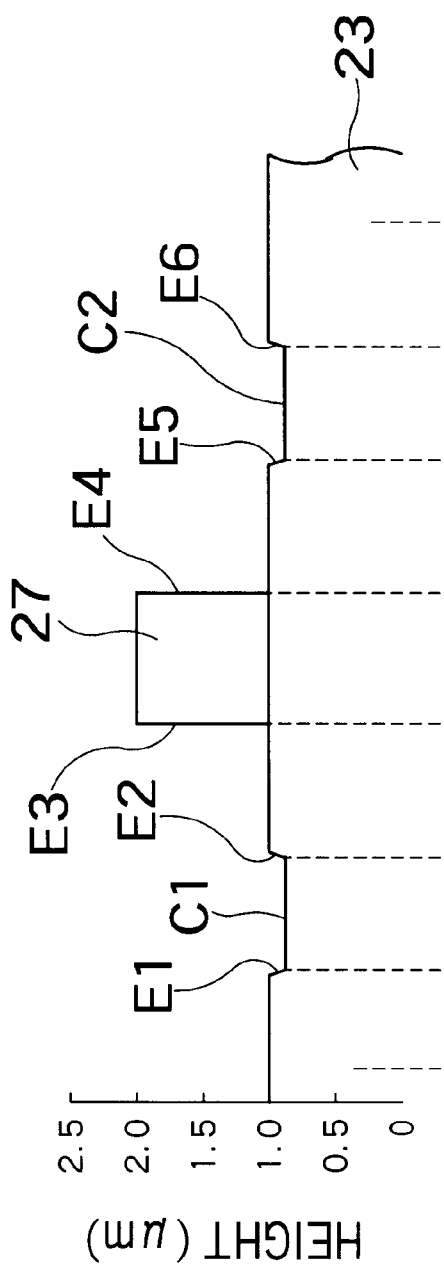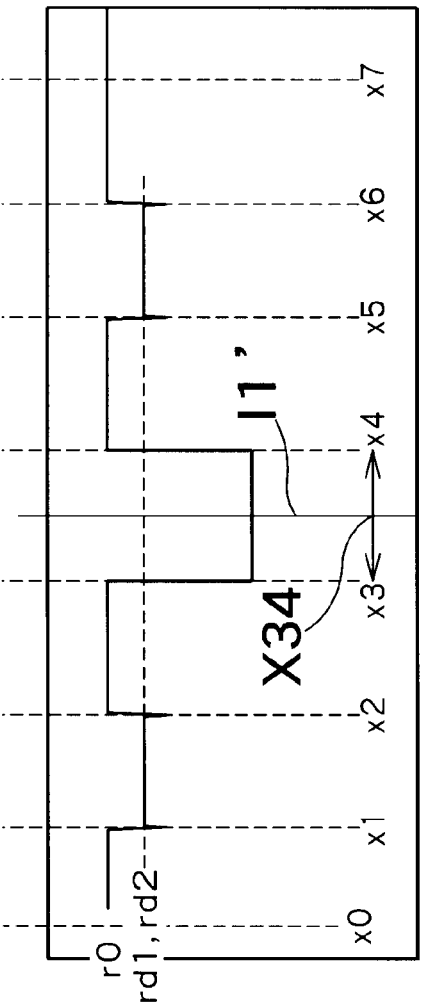
FIG. 3A PRIOR ART
FIG. 3B PRIOR ART

MARK POSITION DETECTING SYSTEM AND METHOD FOR DETECTING MARK POSITION

CROSS REFERENCE TO RELATED APPLICATION

This application claims benefit of priority under 35USC §119 to Japanese patent application No. 2000-086908, filed on Mar. 27, 2000, the contents of which are incorporated by reference herein.

BACKGROUND OF THE INVENTION

1. Field of the Invention

The present invention relates to a system and a method for detecting misalignment between masks in manufacturing a semiconductor device. In more specific, the present invention relates to a system and a method for detecting a position of a misalignment measurement mark which is previously formed on a semiconductor substrate.

2. Description of the Prior Art

In manufacturing a semiconductor device with lamination layers stacked with thin films having different patterns respectively, it is greatly important to accurately align a mask (reticle) with a semiconductor substrate for forming a pattern thereon.

For such mask alignment, a commonly adapted method has steps of previously forming a misalignment measurement mark (which will hereinafter be occasionally referred as a measurement mark) in a region other than that for forming a device on a semiconductor substrate, detecting the position of the measurement mark and adjusting a mask alignment position on the basis of the detected position.

Conventional methods for detecting a position of an alignment measurement mark will hereinafter be described taking a slice level method and a correlation method for instances. In the following respective figures, the same reference numbers are given to the same portions, and the descriptions thereof are appropriately omitted.

FIG. 1 is a schematic diagram showing a conventional measurement mark position detecting system. The misalignment measurement mark position detecting system 110 shown in this figure comprises; a light source 13, a half mirror 15, a stage 70, a CCD (Charge Coupled Device) sensor 33, an A–D (Analogue to Digital) converter 35 and a control computer 110. A Si (silicon) substrate 120 is supported on the stage 70. The substrate 120 is previously provided with a measurement mark 20 which is an object to be measured. In this figure a cross section diagram of the measurement mark 20 is shown taken along a line in the X direction and portions of the substrate 120 other than the measurement mark 20 are omitted.

FIG. 2 is an enlarged view of the measurement mark 20 shown in FIG. 1. As shown in FIG. 2, the measurement mark 20 includes a SiO$_2$ layer 23 formed on the Si substrate 120, and a SiN layer 27 which on the SiO$_2$ layer 23 so as to protrude therefrom. The SiO$_2$ layer 23 and the SiN layer 27 are formed in thickness of T1 and T2 respectively, and each values thereof are 1 $\mu$m in this example. Two concavities C1 and C2 are formed on a surface of the SiO$_2$ layer 23. These concavities have depth D1 and D2 of 0.12 $\mu$m respectively and thus constitute steps. The SiN layer 27 is arranged such that the center thereof is positioned right in the middle of concavities C1 and C2 in the cross section view of the FIG. 2. That is, from the point of view of the SiN layer 27 the SiN layer 27 is arranged such that the center thereof is positioned right in the middle of outside edges E1, E4 of the concavities. The measurement mark 20 thus forms a symmetry shape with respect to the centerline 11 of SiN layer 27.

The position of the measurement mark can be detected by detecting the center point P1 on the top surface of the SiN layer 27. However, a typical method of detecting the point P1 includes a step of recognizing that the center point P1 of the SiN layer 27 coincides with the middle point of the outside edges E1, E4 of concavities C1, C2.

(1) Slice Level Method

Referring FIGS. 3B, 4 and 6 showing waveforms and the flow-chart of FIG. 5, a slice level method for detecting a measurement mark will be described.

First, using the system 100, a beam of light L1 having a predetermined wavelength $\lambda$ or white light is emitted from the light source 13 to irradiate the measurement mark 20 via the half-mirror 15 (step S101). A reflected beam of light L2 is generated from the measurement mark 20. The reflected beam L2 passes through the half-mirror 15 and is detected by a CCD sensor 33 (step S102). The reflected beam L2 includes a ray from the interface between Si substrate 120 and SiO$_2$ layer 23, a ray from the surface of the SiO$_2$ layer 23, a ray from the interface between SiO$_2$ layer 23 and SiN layer 27 and a ray from the surface of the SiN layer 27. Since above mentioned rays interfere each other, the reflected beam L2 enters the CCD sensor 33 as the beam having various light strength dependent on each difference between the optical path lengths from these interfaces or surfaces to a pixel portion of the CCD sensor 33.

In the CCD sensor 33 pixels are arranged in a row in the x direction. Electric charges are generated from each pixel in response to the rays of the reflected beam entering the pixel. Signals from these charges are conveyed to the control computer 110 through the A/D converter 35.

The control computer 110 processes the signals supplied from the CCD sensor 33 to recognize a waveform in a diagram with a horizontal axis and a vertical axis. The horizontal axis denotes X coordinates of the measurement mark in the X direction and the vertical axis denotes strengths of the reflected beam from the measurement mark (step S103). A position coordinate of the measurement mark with respect to the substrate 120 (which will hereinafter referred to as a wafer position coordinate) is detected in a conventional way.

FIG. 3B shows a waveform diagram obtained by the control computer 110 together with the shape of the measurement mark in a cross-sectional view. As shown in FIG. 3B, each position coordinate on the horizontal axis corresponds to a positional coordinate of the measurement mark respectively. For example, edges E1 through E6 of the convexo-concave shape correspond to X1 through X6 of the waveform figure respectively.

As shown in FIG. 3B, assuming that the light strength of the reflected beam from the concavity C1 corresponding the position coordinates from X1 to X2 is rd1, and that the light strength of the reflected beam from the concavity C2 corresponding to the position coordinates form X5 to X6 is rd2, and that the light strength of the reflected beam from the other surface of the SiO$_2$ layer 23 is r0, the following correlation exists between these strengths.

$$ro > rd1, rd2 \tag{1}$$

$$rd1 = rd2 \tag{2}$$

Thus, the waveform of the reflected beam obtained from the measurement mark having a line symmetry shape in a cross section view has a concavity portion in shape in and near the region of the position coordinates from X1 to X2 and a concavity portion in and near the region of the position coordinates from X5 to X6. The entire waveform has a line symmetry shape along a line 11' which passes the middle point X34 of X3 and X4 and is perpendicular to the X-axis.

Referring now to FIG. 4 and FIG. 5, a method for processing a waveform in such a symmetry shape and for detecting the position of the measurement mark 20 by means of a slice level method will be described below.

First, the position XM1 where the light strength drops most sharply in and near a region having position coordinates from X1 to X2 in the waveform figure is detected (step S104).

Similarly, the position XM6 where the light strength rises most sharply in and near a region having position coordinates from X5 to X6 in the waveform figure is detected (step S105).

Next, the middle position XM16 of the position XM1 and the position XM6 acquired at above-mentioned step is calculated (step S106).

Then, at steps similar to the above steps S104 through S0106, the position XM3 where the light strength drops most sharply in a portion having position coordinate of and near the X3, and the position XM4 where the light strength rises most sharply in a portion having position coordinate of and near X4 are detected respectively (steps S107 and S108). Then a middle position XM34 of the X3 and the X4 is calculated (step S109).

At last, the difference between XM34 and XM16 is calculated and the calculated value is outputted as misalignment (step S110).

In the example shown in the waveform diagram of FIG. 4, since the waveform of the light strength of the reflected beam has a symmetric shape, XM1 and the position coordinate X1, and XM6 and the position coordinate X6 coincide with each other respectively. Therefore, it is recognized that XM34−XM16=0 and that MX16 accurately coincides with the middle point of X1 and X6. As a result, the position of the measurement mark can accurately be detected, so that a mask can precisely be aligned with a substrate or a pattern previously formed thereon in a subsequent lithography process.

(2) Correlation Method

Next, a correlation method for detecting a measurement mark will be described referring to FIGS. 1, 3B and 6 showing waveforms and a flow-chart of FIG. 6.

Steps S111 through S113 of obtaining a waveform figure shown in FIG. 3B by irradiating the measurement mark with the light L1 and by detecting the reflected beam L2 with the CCD sensor 33 are substantially the same as steps S101 through S103, and each of step numbers of steps S111 through S113 is that added by 5 to each corresponding step shown in FIG. 5.

As shown in FIG. 6, a portion 11 of the waveform having the position coordinates of and near X1 is extracted. Then, the waveform portion 11 is reversed with respect to a line intersecting X1 and perpendicular to the X-axis by means of a mirror-reversing process to prepare a symmetric graphic. Data on the prepared graphic are then stored in a memory (not shown) as a reference waveform 11inv (step S114).

Next, a portion of the waveform having the position coordinates X5 to X6 and position coordinates in the vicinity hereof is compared with the reference waveform 11inv and the waveform which is most similarity to the reference waveform is detected. Then the position coordinate correspondent to the detected waveform is designated as XN6 (step S115).

Then, a middle point of XN1 corresponding to the waveform portion 11 and the position coordinate obtained at step S115 is calculated and is designated as the middle point XN16 of the position XN1 and the position XN6 (step S116).

Then, the middle point XN34 of the position X3 and the position X4 is calculated at steps similar to the above-mentioned steps S114 through S116 (steps S117 through S119).

At last, the difference between XN34 and XN16 is calculated and the calculated value is outputted as a quantity of misalignment (step S120).

By means of the correlation method described above, when a waveform obtained from the reflected beam is symmetric, XN16 coincides exactly with the middle point XN34 of the position coordinate X3 and the position coordinate X4, so that it is possible to accurately detect the position of the measurement mark 20.

However, both the slice level method and the correlation method which are described above have a problem that a mark position cannot accurately be detected when a measurement mark has a non-symmetric shape. This problem will be described in more detail below.

FIG. 7 shows an example of a misalignment measurement mark having a non-symmetric cross sectional shape. Materials and film thickness of elements constituting the measurement mark 21 shown in FIG. 7 are the same as those of the measurement mark 20 shown in FIG. 2. And the fact that SiN layer 27 is arranged right in the middle of two concavities C3 and C4 is also the same as the aforementioned measurement mark 21.

However, depths D1' and D2' of the two concavities C3 and C4 arranged on $SiO_2$ layer 24 of the measurement mark 21 are different from those of the measurement mark 20. In specific, the concavities C3 and C4 are formed in depths D1'=0.1 $\mu$m and D2'=0.14 $\mu$m respectively. Due to such constitution the measurement mark 21 has a non-symmetric cross sectional shape with respect to the centre line 12 of SiN layer 27. For this reason, when strength distribution of the reflected beam from the measurement mark 21 is obtained at steps S101 through S103 shown in FIGS. 5 and 11, the waveform thereof is then acquired as shown in FIG. 8B because a phase of the reflected beam from the portion of the concavity C4 reverses.

When the position of the measurement mark 21 is intended to be detected using the waveform shown in FIG. 8B by means of conventional methods, following problems occur.

Slice Level Method

As shown in FIG. 9, XM1 corresponds to the position coordinate of X1 at the step of detecting the position coordinate XM1 where the strength of the reflected beam drops most sharply in and near the position coordinates from X1 to X2 (step S104 in FIG. 5).

However, XM6 corresponds not to the position coordinate X6 but to the position coordinate X5 at a step of detecting a position coordinate XM6 where the rise of the light strength is expected to be most steep in and near the position coordinates from X5 to X6 (step S105 in FIG. 5). The middle point thereof then corresponds not to the middle position of the position coordinate X1 and X6 but to the middle position of the position coordinate X1 and X5. For this reason, XM16 never coincides with the middle point XM34 of XM3 and MX4 which are obtained at steps S107 through S109, and an error occurs by a distance of XE shown in FIG. 9. As a result, this error renders it impossible to accurately detect a misalignment with a mask in a subsequent process.

Correlation Method

As can be seen from FIG. 10, a mirror-reversed waveform 13*inv*' (not shown) of a waveform portion having position coordinates of and near X3 is most similar to a portion of the waveform having position coordinates of and near X4. The middle position XN34 of the detected position coordinates corresponds to the middle point of X3 and X4 similarly to the example of symmetric cross sectional shape.

However, a mirror-reversed waveform 11*inv*' prepared from a portion of the waveform 11' having position coordinates of and near X1 is most similar to that having position coordinates of and near X5. Then the middle point XN16 thereof corresponds not to the middle point of the position coordinate X1 and X6 but to the middle point of the position coordinate X1 and X5. For this reason, as shown in FIG. 10, an error occurs by a distance of XE between XN16 and the middle pointXN34 of XN3 and MN4 obtained at steps S117 through S119 shown in FIG. 11. As a result, this error renders it impossible to precisely detect misalignment between the measurement mark 21 and a mask.

As mentioned above, according to the conventional methods, a position of a measurement mark can accurately detected when a cross sectional shape of the mark is symmetric, however, there is a problem that a position of a mark having a non-symmetric cross sectional can not be precisely detected.

SUMMARY OF THE INVENTION

It is therefore an object of the present invention to provide a mark position detecting system which can accurately detect the position of an alignment measurement mark even if the cross sectional shape thereof is not symmetric.

It is another object of the present invention to provide a method for precisely detecting the position of an alignment measurement mark even if the cross sectional shape thereof is not symmetric.

According to a first aspect of the present invention, there is provided a mark position detecting system comprising: a light emitter for emitting light to irradiate a mark for misalignment measurement, the mark being formed on a semiconductor substrate, shape information of the mark and material information of an element constituting the mark are previously given; a light detector for detecting a reflected beam of light emitted from the mark on irradiation of the light; a waveform recognition part for preparing a measured waveform on the basis of the detected result of the light detector, the measured waveform denoting strength distribution of the reflected beam according to the shape and the material of the mark; a theoretical waveform preparing part for preparing a theoretical reflected beam waveform on the basis of the shape information and the material information of the mark, the theoretical reflected beam waveform denoting theoretical strength distribution of the reflected beam which would be obtained by irradiating a desired region of the mark with the light; and a determining part for comparing the measured waveform with the theoretical reflected beam waveform to acquire positional information on a place on a surface of the substrate, the place corresponding to the portion of the measured waveform which is most similar to the theoretical reflected beam waveform and for detecting the position of the mark on the basis of the acquired positional information.

Because the theoretical waveform preparing part prepares the theoretical reflected beam waveform on the basis of the shape information and the material information of the mark, and the determining part compares the measured waveform with the theoretical reflected beam waveform, it is possible to accurately acquire a positional information on a desired place on the substrate for specifying the mark. Therefore, the position of the mark can be precisely detected whether a cross sectional shape of the mark is, for example symmetric or non-symmetric.

The theoretical waveform preparing part may preferably prepare the theoretical reflected beam waveform of a spot at which strength of the reflected beam changes. This enables to obtain positional information on a characteristic place of the mark.

In a preferred embodiment of the present invention, the mark includes a first thin film formed of a first material on the substrate and a second thin film formed of a second material on the first film so as to protrude from the first film, the first thin film being provided thereon with a first concavity having a first depth and a second concavity having a second depth, the first concavity and the second concavity are spaced from each other, and, the second thin film being arranged in the middle of the first and second concavities, the shape information includes step information concerning a thickness of the first thin film, a thickness of the second thin film, the first depth and the second depth, the theoretical waveform preparing part prepares a first through a fourth theoretical reflected beam waveforms, the first theoretical reflected beam waveform corresponding to a first place which equivalent to an outside edge of the first concavity in view of the second thin film, the second theoretical reflected beam waveform corresponding to a second place which equivalent to an outside edge of the second concavity in view of the second thin film, the third theoretical reflected beam waveform corresponding to a third place equivalent to a first sidewall of the second thin film and the fourth theoretical reflected beam waveform corresponding to a fourth place equivalent to a second sidewall of the second thin film, the second sidewall being faced to the first sidewall, and the determining part compares the measured waveform with the first through fourth theoretical reflected beam waveforms respectively, calculates a first middle point position which is the middle point of a first edge position corresponding to the first place and a second edge position corresponding to the second place, calculates a second middle point which is the middle point of the first sidewall position corresponding to the third place and the second sidewall position corresponding to the fourth place, and determines whether any alignment occurs between the first middle point and the second middle point.

When a mark in the above mentioned shape is used and the determining part determines whether any alignment occurs between the first middle point and the second middle point, it is possible to confirm whether there is any detected error or not, so that the position of the mark can be detected with a high degree of accuracy.

According to a second aspect of the present invention, there is provided a mark position detecting system comprising: a light emitter for emitting light to irradiate a mark for misalignment measurement, the mark being formed on a semiconductor substrate, material information of an element constituting a surface portion of the mark being previously given; a spectroscope for diffracting a reflected beam of light into a ray having an arbitrary wavelength, the reflected beam being emitted from the mark on irradiation of the light; a first light detector for detecting the diffracted ray diffracted by the spectroscope; a shape information acquiring part for receiving the detected result of the first light detector and the material information, recognizing a measured diffracted ray waveform denoting strength distribution of the diffracted ray according to the shape and the material of the mark and for acquiring shape information of the mark by analyzing the measured diffracted ray waveform; a second light detector for detecting the reflected beam, the reflected beam being light emitted from the light emitter and reflected on the mark; a waveform recognition part for preparing a measured waveform on the basis of the detected result of the second light detector, the measured waveform denoting strength distribution of the reflected beam according to the shape and the material of the mark; a theoretical waveform preparing part for preparing a theoretical diffracted ray waveform which is a theoretical waveform of the diffracted ray on the basis of the material information, for supplying the theoretical diffracted ray waveform to the shape information acquiring part and for preparing a theoretical reflected beam waveform on the basis of the shape information given from the shape information acquiring part and the material information, the theoretical reflected beam waveform denoting theoretical strength distribution of the reflected beam which would be obtained by irradiating a desired region of the mark with the light; and a determining part for comparing the measured waveform with the theoretical reflected beam waveform to acquire positional information on a place on a surface of the substrate, the place corresponding to the portion of the measured waveform which is most similar to the theoretical reflected beam waveform, and for detecting the position of the mark on the basis of the acquired the positional information.

According to the second aspect, the mark position detecting system further comprises the shape information acquiring part, so that the shape information of a misalignment mark can also be acquired with a single system. Therefore, it is possible to detect a position of the mark with high throughput.

It is advantageous that the mark position detecting system in the second aspect of the invention further comprises a parameter calculating part for generating a plurality of parameters capable of being candidates to the shape information and for supplying the parameters to the shape information acquiring part, wherein the theoretical waveform preparing part prepares the theoretical diffracted ray waveform on the basis of the material information every the parameter, and the shape information acquiring part compares the measured diffracted ray waveform with the theoretical diffracted ray waveform of every the parameter, selects the theoretical diffracted ray waveform which is most similar to the measured diffracted ray waveform of the theoretical diffracted ray waveforms and determines the parameter of the selected theoretical diffracted ray waveform as the shape information.

According to a third aspect of the present invention, there is provided a method of detecting a mark position, the mark being formed on a semiconductor substrate for misalignment measurement, the method comprising steps: acquiring material information on an element constituting the mark; acquiring shape information on the mark; irradiating the mark with light; detecting a reflected beam of light emitted from the mark on irradiation of the light; acquiring a measured waveform denoting strength distribution of the reflected beam according to the shape and the material of the mark on the basis of the detected result of the reflected beam; preparing a theoretical reflected beam waveform on the basis of the shape information and the material information on the mark, the theoretical reflected beam waveform denoting theoretical strength distribution of the reflected beam which would be obtained by irradiating a desired region of the mark with the light; comparing the measured waveform with the theoretical reflected beam waveform to acquire positional information on a place on a surface of the substrate, the place corresponding to the portion of the measured waveform which is most similar to the theoretical reflected beam waveform; and detecting the position of the mark on the basis of the acquired the positional information.

According to the third aspect of the invention, a theoretical reflected beam waveform is prepared the basis of the shape information and the material information on the mark, so that it is possible to accurately acquire a positional information on a desired place on the substrate for specifying the mark. Therefore, the position of the mark can be precisely detected whether a cross sectional shape of the mark is, for example symmetric or non-symmetric.

In the mark position detecting method the step of acquiring shape information on the mark may preferably include steps;

diffracting the reflected beam into a ray having an arbitrary wavelength and detecting the diffracted ray in accordance with a surface shape and a material of the mark, recognizing a measured diffracted ray waveform denoting strength distribution of the diffracted ray and acquiring the shape information on the mark by analyzing the measured diffracted ray waveform.

Thus, the shape information of the misalignment mark can also be acquired in a series of steps, it is possible to detect a position of the mark with high throughput.

In a preferred embodiment of the method of detecting a mark position, the step of acquiring the shape information includes steps of; generating a plurality of parameters capable of being candidates to the shape information, preparing a theoretical diffracted ray waveform on the basis of the material information every the parameter, the theoretical diffracted ray waveform being a theoretical waveform of the diffracted ray, comparing the measured diffracted ray waveform with the theoretical diffracted ray waveform of every the parameter, selecting the theoretical diffracted ray waveform which is most similar to the measured diffracted ray waveform of the theoretical diffracted ray waveforms, and determining the parameter of the selected theoretical diffracted ray waveform as the shape information.

Furthermore, in a further preferred embodiment of the method of detecting a mark position, the mark includes a first thin film formed of a first material on the substrate and a second thin film formed of a second material on the first film so as to protrude from the first film, the first thin film being provided thereon with a first concavity having a first depth and a second concavity having a second depth, the first concavity and the second concavity are spaced from each other, and, the second thin film being arranged in the middle of the first and second concavities, the shape information includes step information concerning a thickness of the first thin film, a thickness of the second thin film, the first depth and the second depth, the step of preparing theoretical reflected beam waveform is a step of preparing a first through a fourth theoretical reflected beam waveforms, the first theoretical reflected beam waveform corresponding to a first place which equivalent to an outside edge of the first concavity in view of the second thin film, the second theoretical reflected beam waveform corresponding to a second place which equivalent to an outside edge of the second concavity in view of the second thin film, the third theoretical reflected beam waveform corresponding to a third place equivalent to a first sidewall of the second thin film and the fourth theoretical reflected beam waveform corresponding to a fourth place equivalent to a second sidewall of the second thin film, the second sidewall being faced to the first sidewall, and the step of detecting the position of the mark is a step of calculating a first middle point position which is the middle point of a first edge position corresponding to the first place and a second edge position corresponding to the second place, calculating a second middle point which is the middle point of the first sidewall position corresponding to the third place and the second sidewall position corresponding to the fourth place, and determines whether any alignment occurs between the first middle point and the second middle point.

When a mark in the above mentioned shape is used and it is determined whether any alignment occurs between the first middle point and the second middle point, it is possible to confirm whether there is any detected error or not, so that the position of the mark can be detected with a high degree of accuracy.

BRIEF DESCRIPTION OF THE DRAWINGS

The present invention will be understood more fully from the detailed description given below and from the accompanying drawings of the preferred embodiments of the invention. However, the drawings are not intended to imply limitation of the invention to a specific embodiment, but are for explanation and understanding only.

In the drawings:

FIG. 3A is a cross-sectional view showing the shape of the measurement mark shown in FIG. 2 and FIG. 3B shows an example of a waveform denoting light strength of reflected beam from the measurement mark shown in FIG. 3A in association with position coordinates of the measurement mark;

DESCRIPTION OF THE PREFERRED EMBODIMENTS

Referring now to the accompanying drawings, some preferred embodiments of the present invention will be described below.

(1) First Preferred Embodiment

Figure 12:
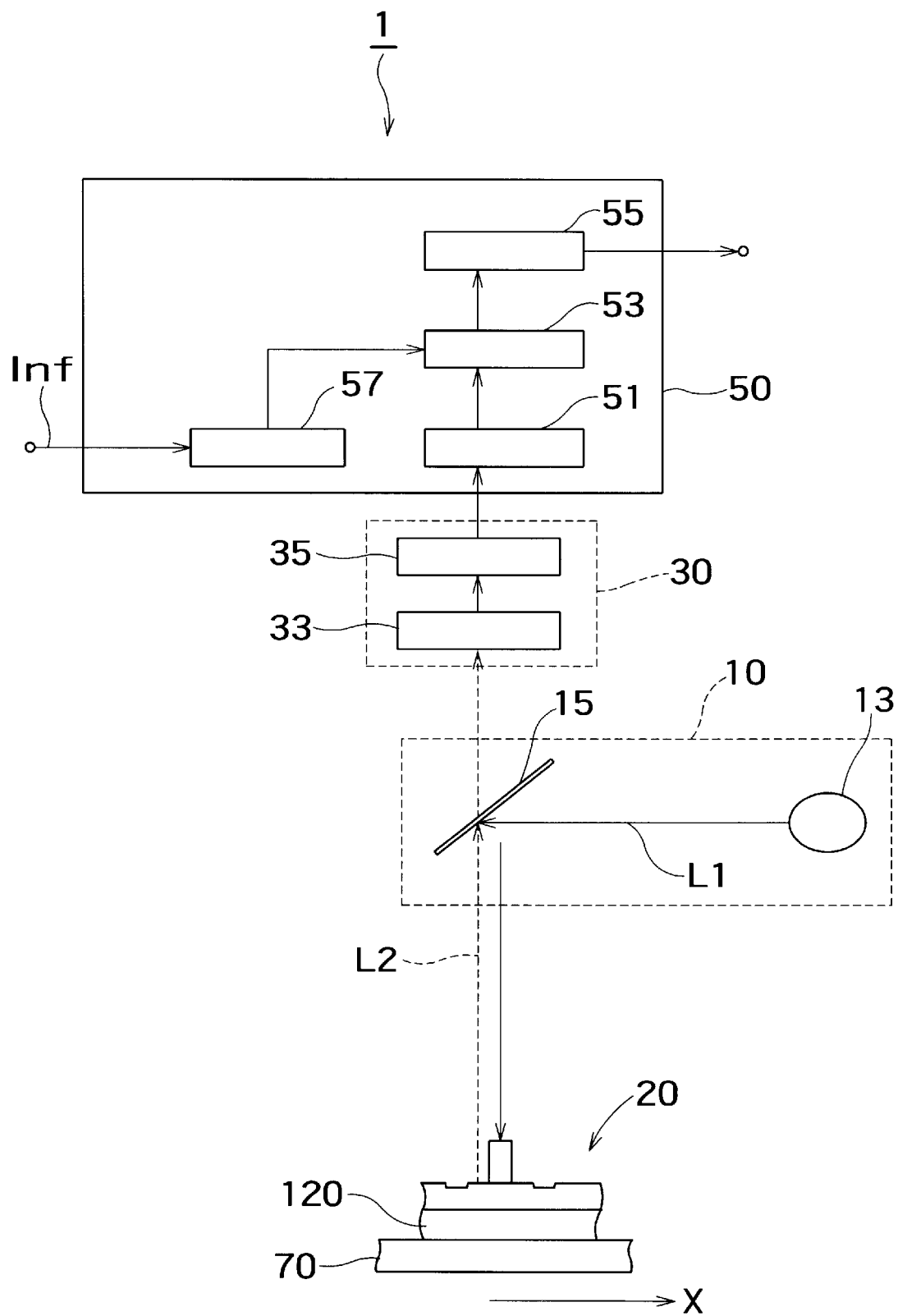
FIG. 12 is a schematic diagram showing the construction of the first embodiment of a mark position detecting system according to the present invention.

FIG. 12 is a schematic diagram showing the construction of the first embodiment of a mark position detecting system according to the present invention.

As shown in FIG. 12, the mark position detecting system 1 of the present embodiment comprises an illumination optical system 10, a stage 70, a detection optical system 30 and a control computer 50.

The stage 70 supports thereon a substrate 120 which is provided with a misalignment measurement mark as an object to be measured.

The illumination optical system 10 includes a light source 13 and a half mirror 15. The light source 13 emits light L1 having an arbitrary wavelength $\lambda$ on the basis of a command supplied from the control computer 50.

The detection optical system 30 includes a CCD sensor 33 and an A/D (analogue to digital) converter 35. The CCD sensor 33 detects the reflected beam L2 from the misalignment measurement mark 20, and generates a signal of electric charges according to the strength of the detected beam. The A/D converter 35 receives the analogue signal supplied from the CCD sensor 33 to convert the signal to a digital signal.

The control computer 50 includes a measured waveform diagram preparing part 51, a theoretical waveform preparing part 57, a waveform comparison part 53 and a misalignment operation part 55.

The waveform diagram preparation part 51 receives the digital signal from the A/D converter 35 to prepare a waveform diagram of the measured beam on the basis of the received digital signal. The waveform diagram has a horizontal axis and a vertical axis, the horizontal axis denoting position coordinates of the substrate 120 in the X direction and the vertical axis denoting strengths of the reflected beam.

The theoretical waveform preparing part 57 receives information Inf concerning a material and a shape of the misalignment measurement mark, calculates strength of a reflected beam corresponding to that from a desired position of the measurement mark by means of simulation and prepares a theoretical waveform. In this embodiment, information Inf on the misalignment measurement mark includes the material and the thickness T1 of the $SiO_2$ film (the first film), each height of steps (depths) D1, D2 of the first and second concavities C1, C2, and the material and the thickness T2 of the SiN film (the second film).

The waveform comparison part 53 compares the measured waveform with the theoretical waveform, detects a portion of the measured waveform which is most similar to the theoretical waveform and output a position coordinate of the measured waveform corresponding thereto.

The misalignment operation part 55 carries an arithmetical operation on the positional information supplied from the waveform comparison part 53, determines whether there is an error in the measured result or not and outputs the value when any error exists.

Referring to the accompanying drawings, as a preferred embodiment of a mark position detecting method according to the present invention, the operation of the mark position detecting system 1 of the above-mentioned embodiment will be described below. In addition, the same mark as the measurement mark shown in FIGS. 2 and 7 will be used as a misalignment measurement mark in the following description for easy comparison with the conventional methods.

Figure 13:
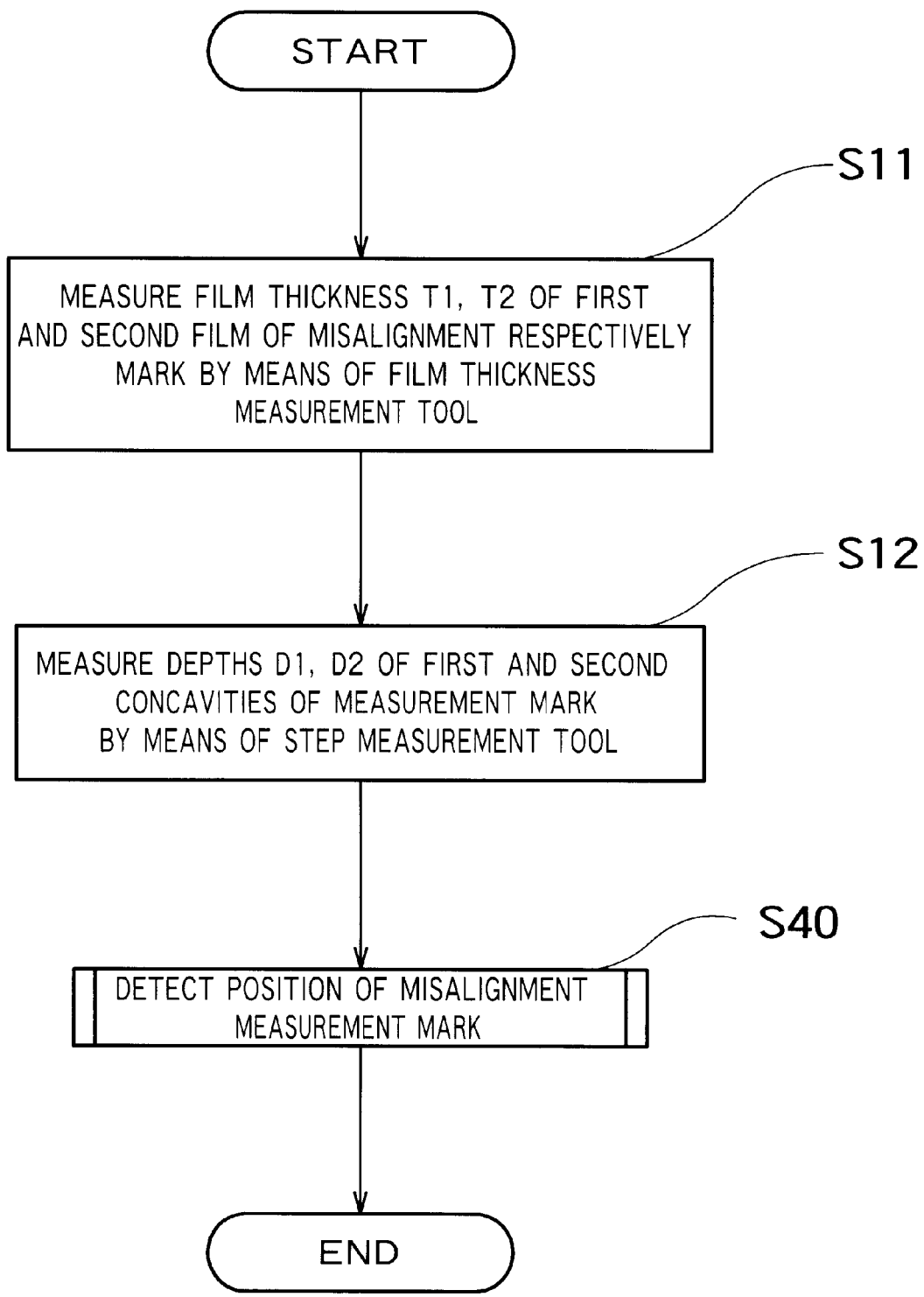
FIG. 13 is an overview flow chart for explaining the mark position detecting method in the first embodiment of a method for detecting a mark position according to the invention.
Figure 14:
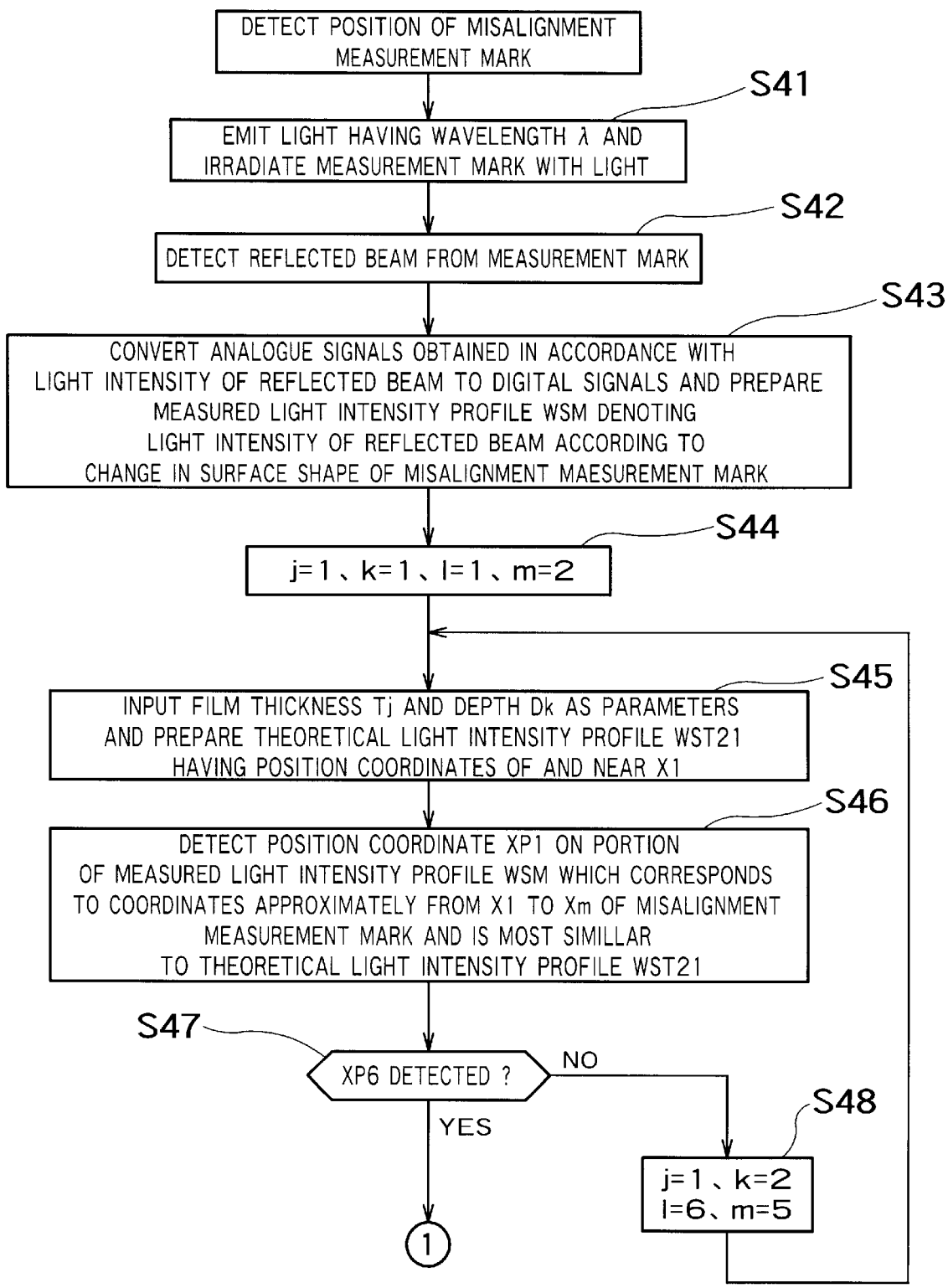
FIGS. 14 and 15 are flow charts for explaining the mark position detecting method in the first embodiment of a method for detecting a mark position according to the invention.
Figure 15:
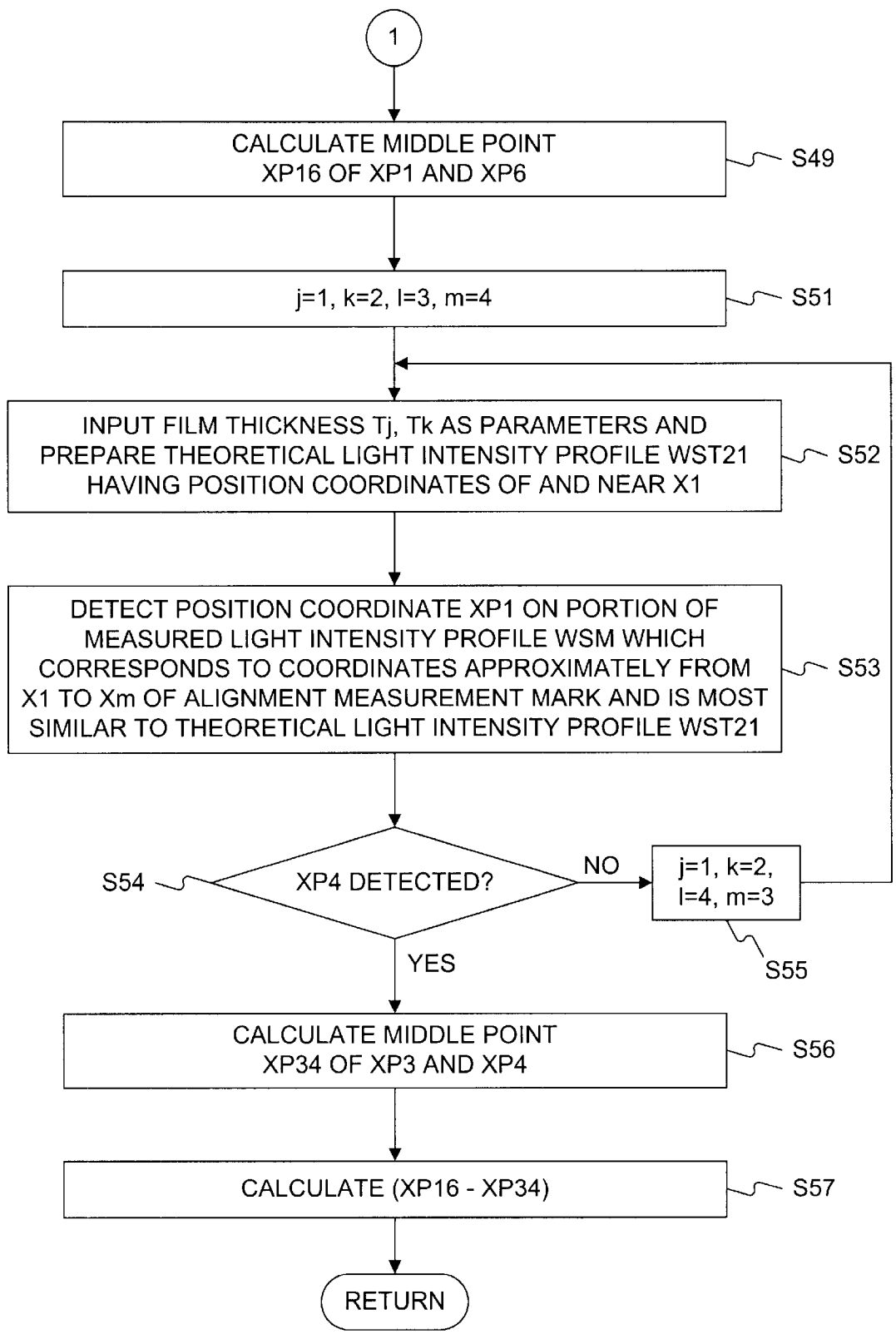

FIGS. 13 through 15 are flow charts for explaining the mark position detecting method in the present embodiment. FIG. 13 is an overview flow chart showing a series of steps in the embodiment, and FIGS. 14 and 15 shows a series of main steps which will be described later.

In this preferred embodiment the thickness of films and the depths of the concavities of the measurement mark are previously measured as a pre-process prior to detection of the position of the measurement mark. Steps S11 and S12 in FIG. 13 denote the pre-process prior to the measurement. Meanwhile, the step S40 (FIGS. 14 and 15) denotes the maim process for the measurement. The pre-process and the main process are separately described below.

(A) Pre-Process

Figure 1:
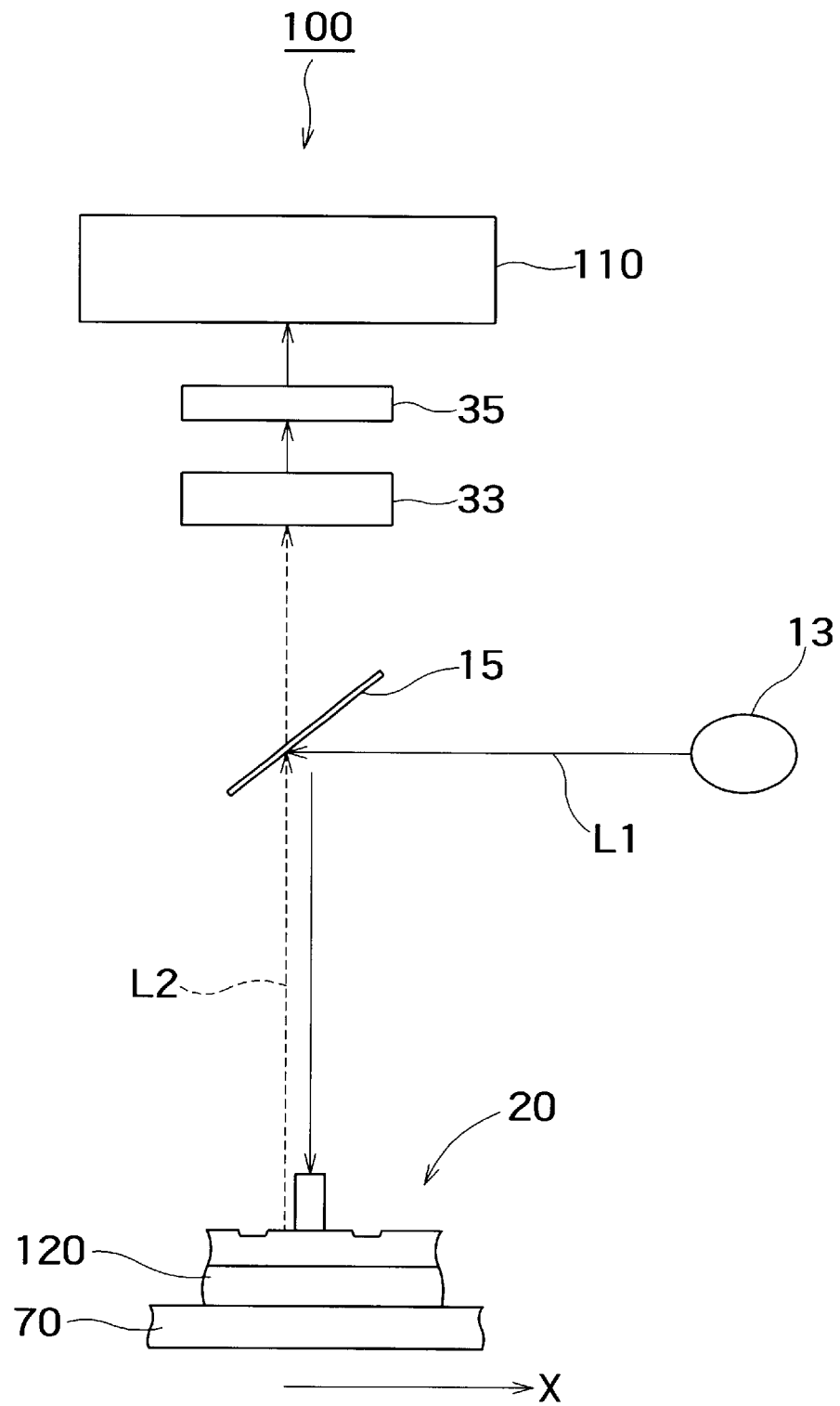
FIG. 1 is a schematic diagram showing a conventional measurement mark position detecting system.
Figure 2:
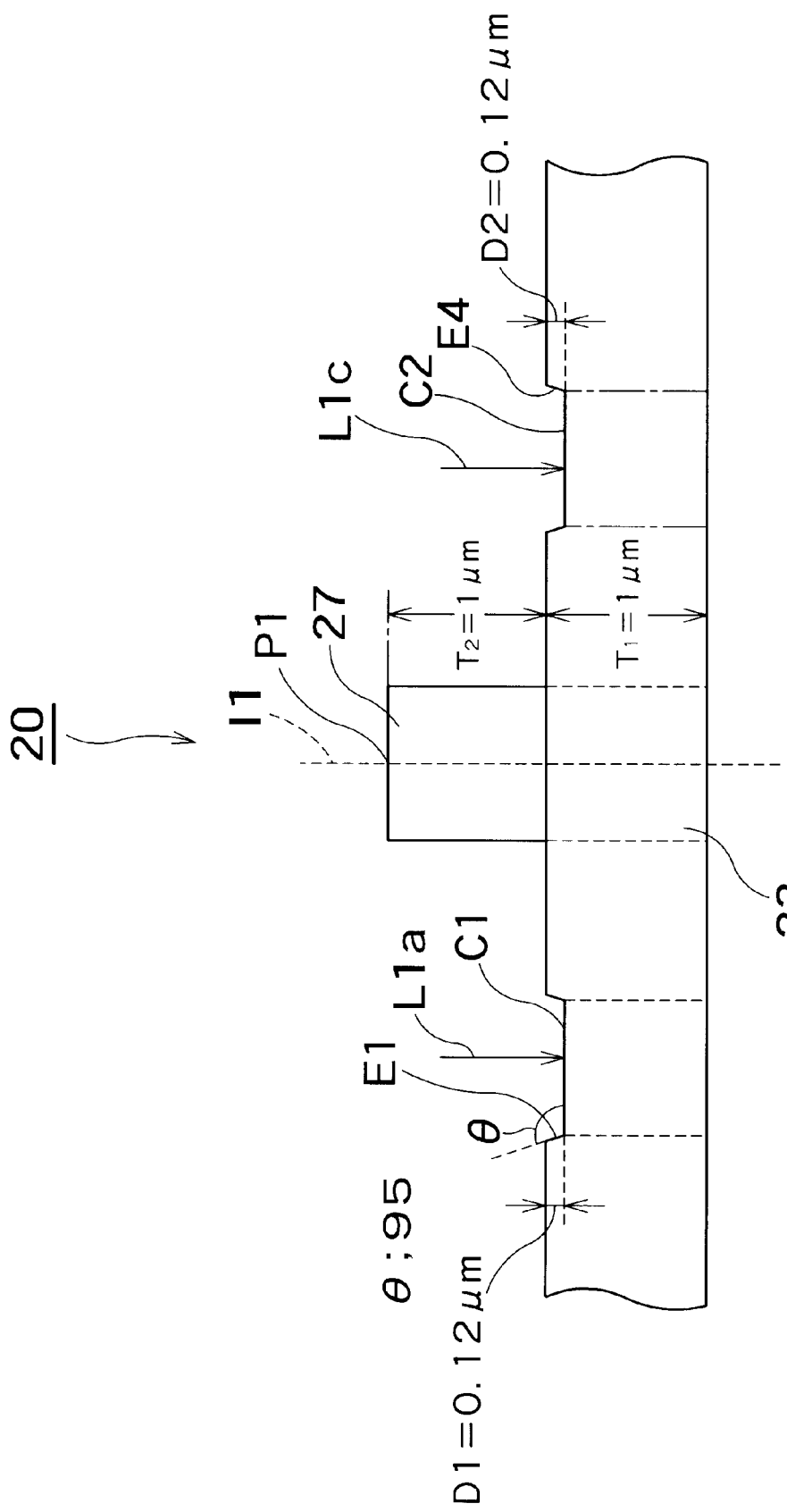
FIG. 2 is an enlarged view of the measurement mark shown in FIG. 1.
Figure 7:
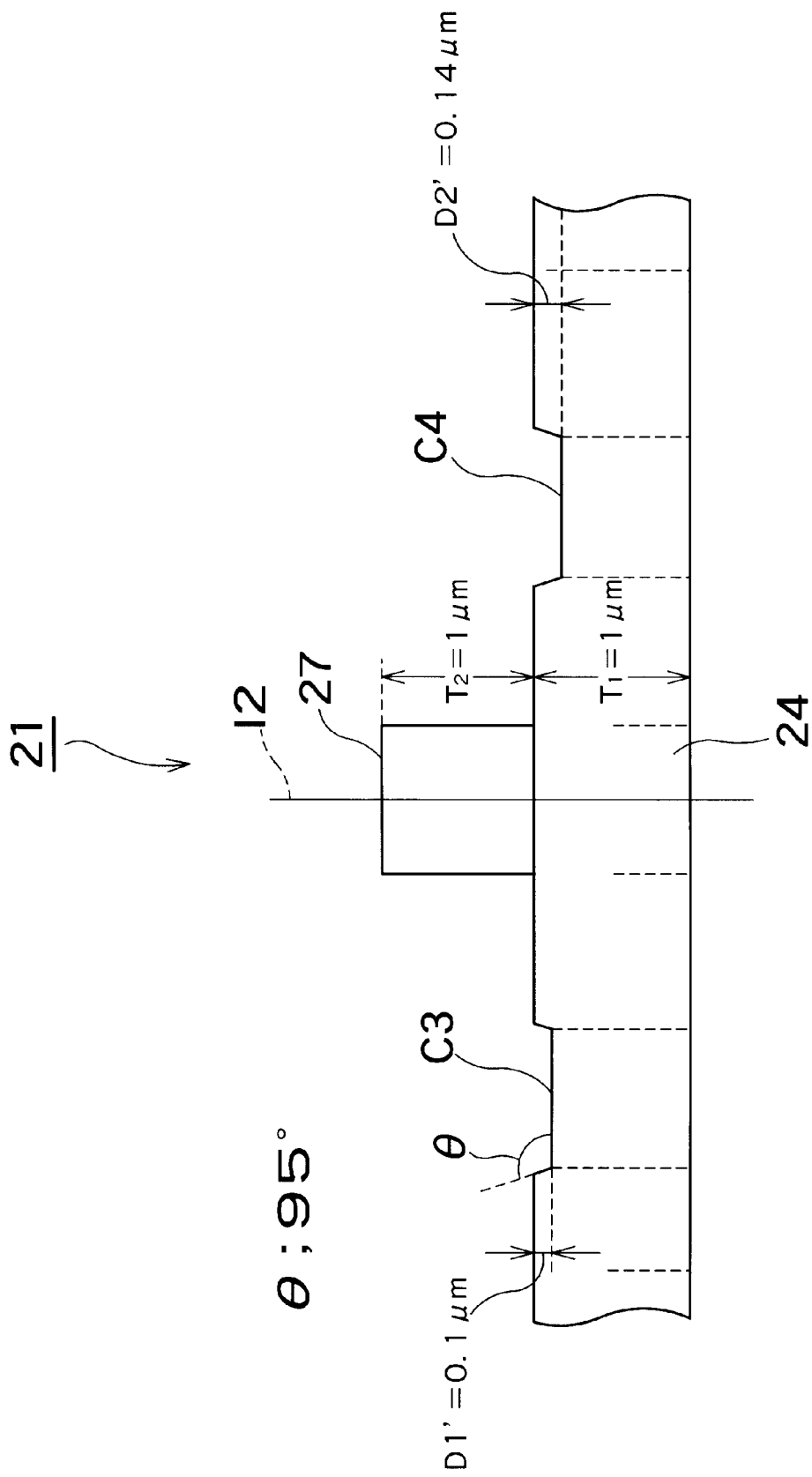
FIG. 7 is an illustration showing an example of a measurement mark having a non-symmetric cross sectional shape.
Figure 8A:
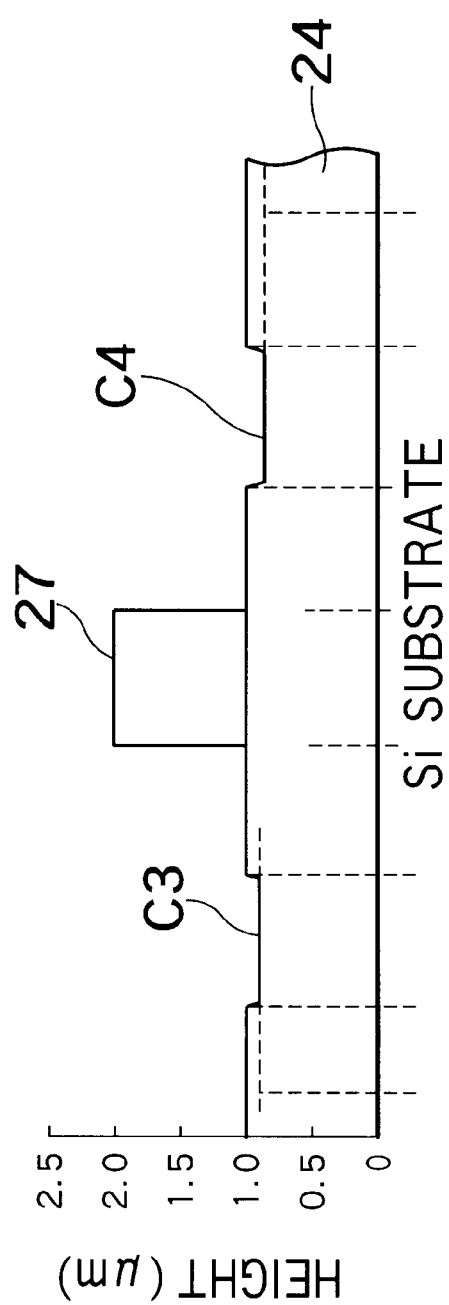
FIG. 8A is a cross-sectional view showing the shape of the measurement mark shown in FIG. 7
Figure 8B:
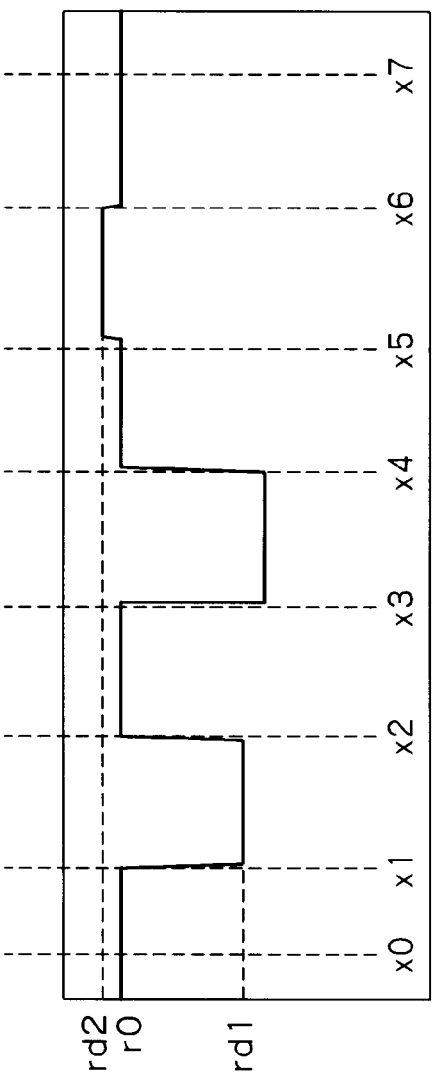
FIG. 8B is a schematic diagram showing a waveform denoting light strength of reflected light from the measurement mark shown in FIG. 7 in association with position coordinates of the measurement mark.
Figure 9:
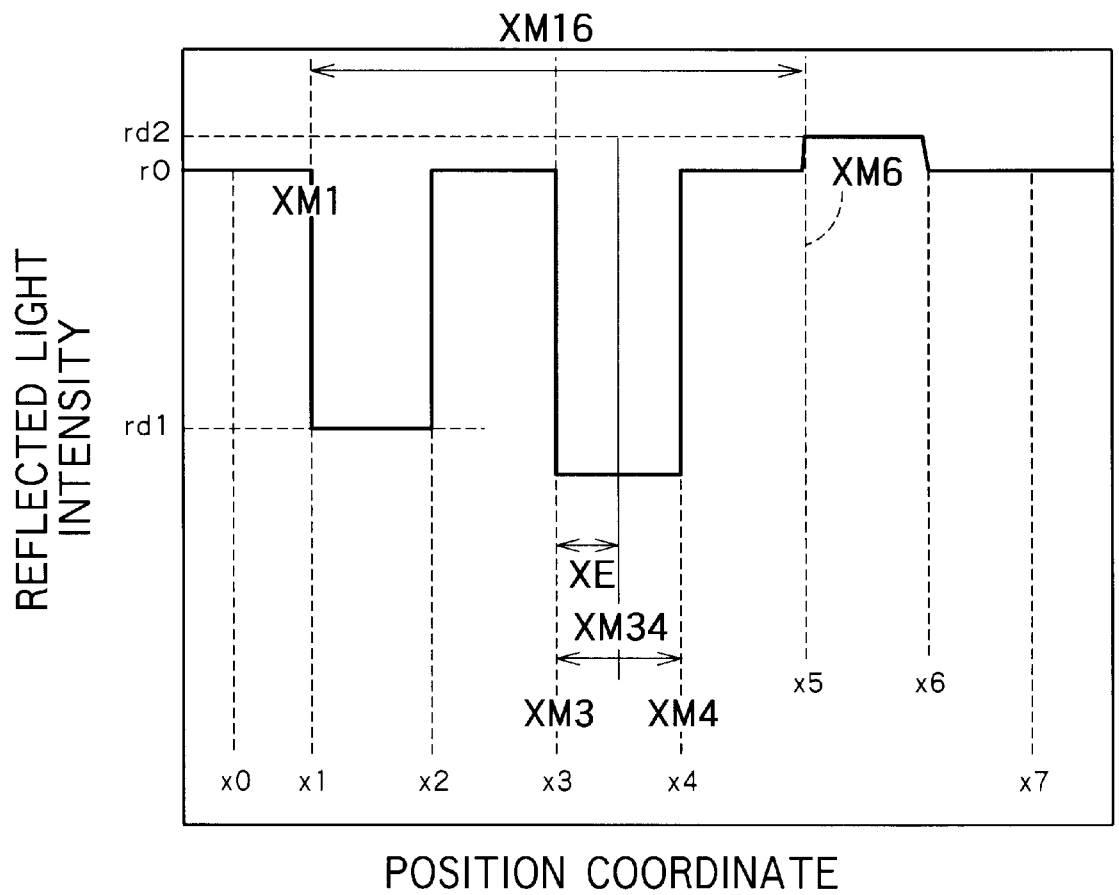
FIG. 9 is a schematic diagram showing a waveform for explaining the slice level method.
Figure 10:
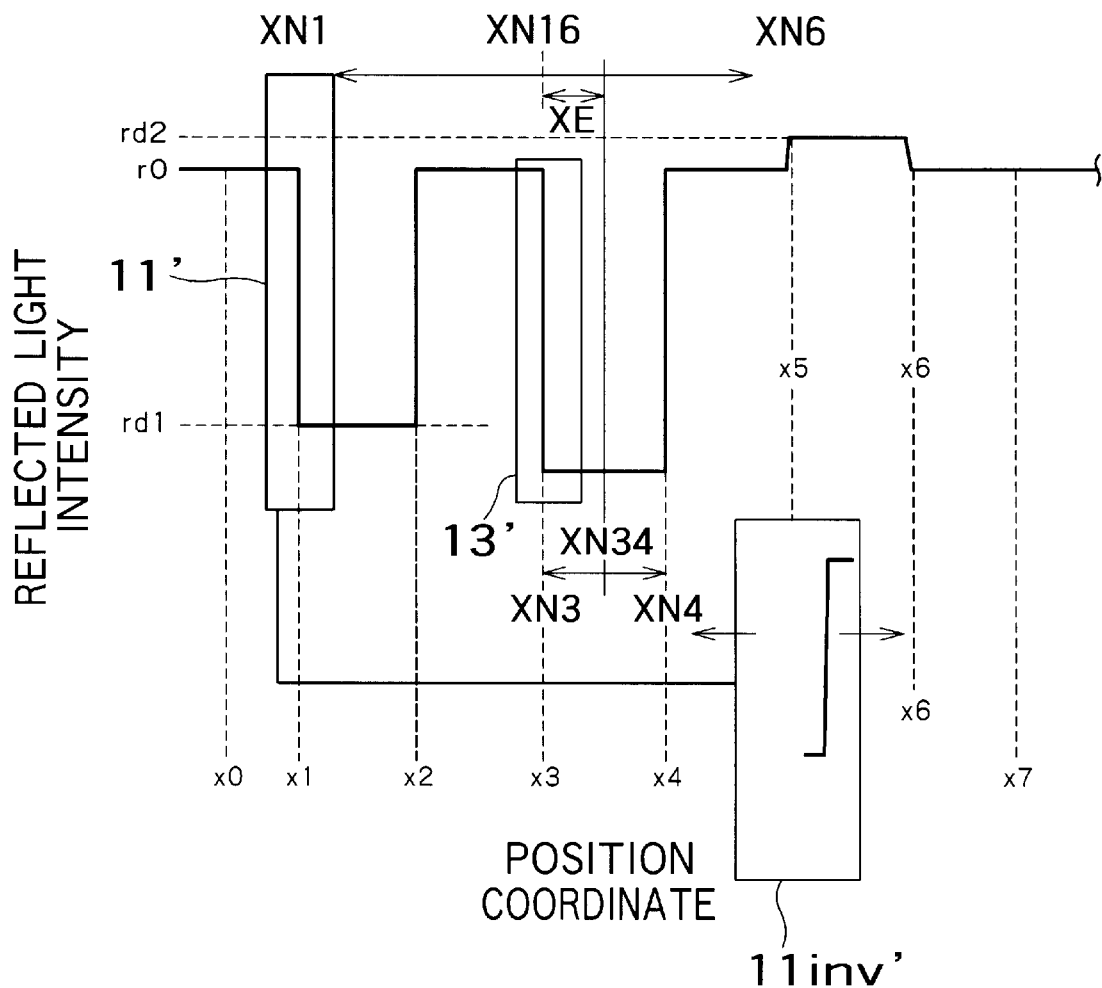
FIG. 10 is a schematic diagram showing a waveform for explaining the correlation method.
Figure 11:
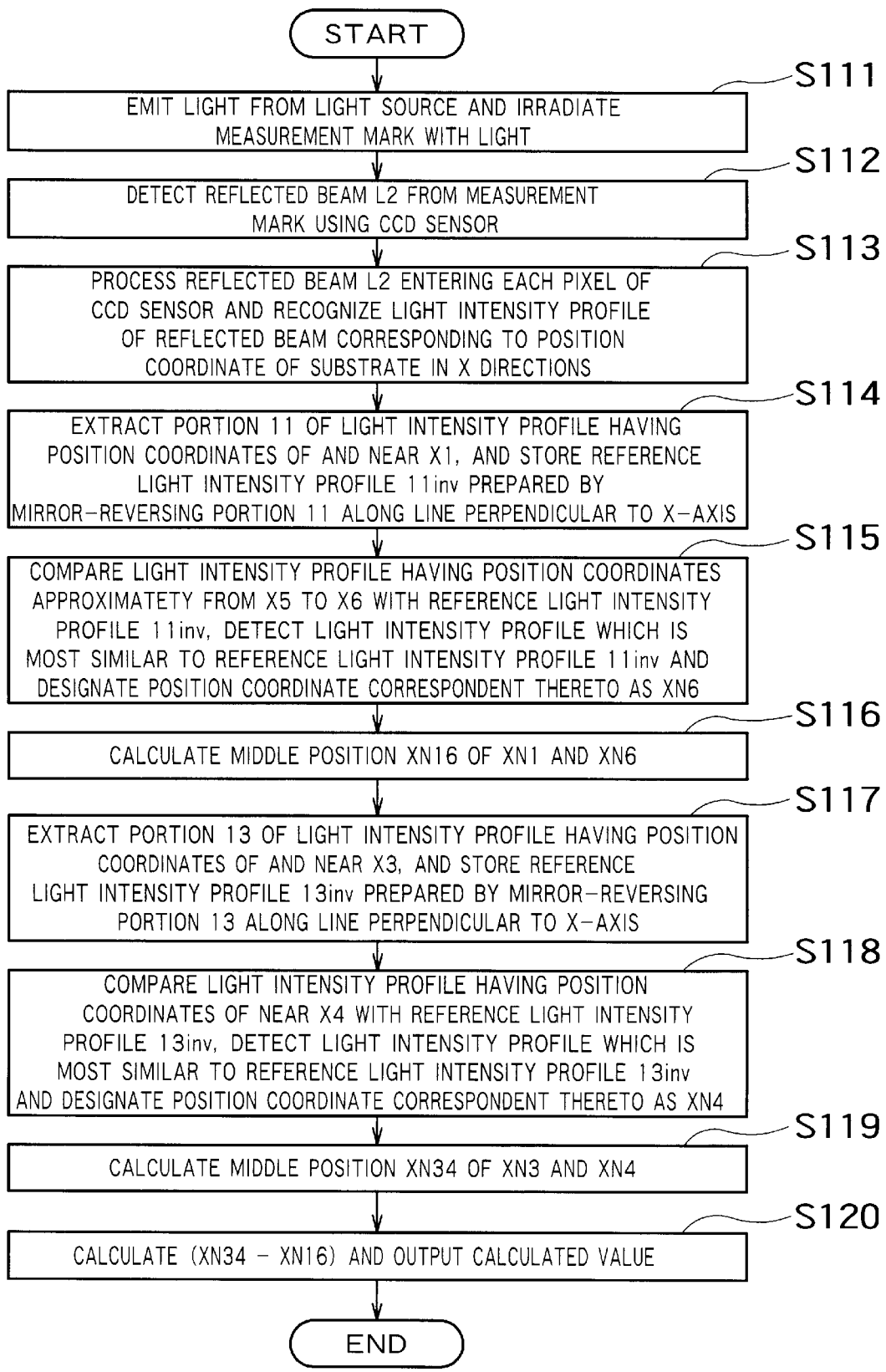
FIG. 11 is a flow chart for explaining the correlation method.

First, as shown in FIG. 13, with respect to the measurement mark shown in FIGS. 2 or 7, the film thickness T1 (the first film thickness) of the $SiO_2$ layer 23 and the film thickness T2 (the second film thickness) of the SiN layer 27 is measured with a thicknessmeter (not shown)(step S11).

Then, depths of first and second concavities of the measurement mark are measured with a step measuring instrument (a thicknessmeter, not shown) (step S12). With respect to the symmetric measurement mark 20 shown in FIG. 2, the first and second depths correspond to the depths D1 and D2 of the concavities C1 and C2 respectively. With respect to the measurement mark 21 shown in FIG. 7, the first and second depths correspond to the depths D1' and D2' of the concavities C3 and C4 respectively.

(B) Main Process

A position of a misalignment measurement mark is then detected using data on the film thickness and the depths obtained the above-mentioned pre-process (step S40).

First, as shown in FIG. 14, light L1 having a wavelength $\lambda$ is emitted from the light source 13 of the mark position measurement system 1 to illuminate the misalignment measurement mark via the half mirror 15 (step S41). light L1 is then deflected on the misalignment measurement mark to be the reflected beam of light L2. The reflected beam L2 passes through the half mirror 15 again to be incident on a pixel part of the CCD sensor 33 as a beam of light having strength dependent on the difference between optical path lengths of rays consisting the beam.

The CCD sensor 33 detects the reflected beam L2. That is, electric charges are generated in accordance with the strength of the reflected beam incident on each pixel part (step S42) and the CCD sensor 33 supplies signals of the charges to the A/D converter 35 as analogue signals.

The A/D converter 35 converts the signals supplied from the CCD sensor 33 to digital signals and supplies the converted signals to the control computer 50. The measured waveform preparing part 51 in the control computer 50 recognizes strength distribution of the reflected beam dependent on a change of the surface of the misalignment measurement mark on the basis of the supplied signals to prepare a measured waveform diagram showing a measured waveform WSM (step S43). The measured waveform diagram corresponds to a diagram which has a horizontal axis and a vertical axis and is plotted with measured values. The horizontal axis denotes position coordinates in X directions of a plane parallel to the surface of the substrate 120 having the measurement mark and the vertical axis denotes the strengths of the reflected beam from the measurement mark.

Steps of detecting a position of a misalignment measurement mark by processing the measured waveform WSM will be described below separately in a case in which a measurement mark has a symmetrical cross sectional shape such as the measurement mark 20 shown in FIG. 2 and a case in which a measurement mark has a non-symmetrical cross sectional shape such as the measurement mark 21 shown in FIG. 7.

(a) When Cross Sectional Shape Of Measurement Mark Is Symmetric

Figure 4:
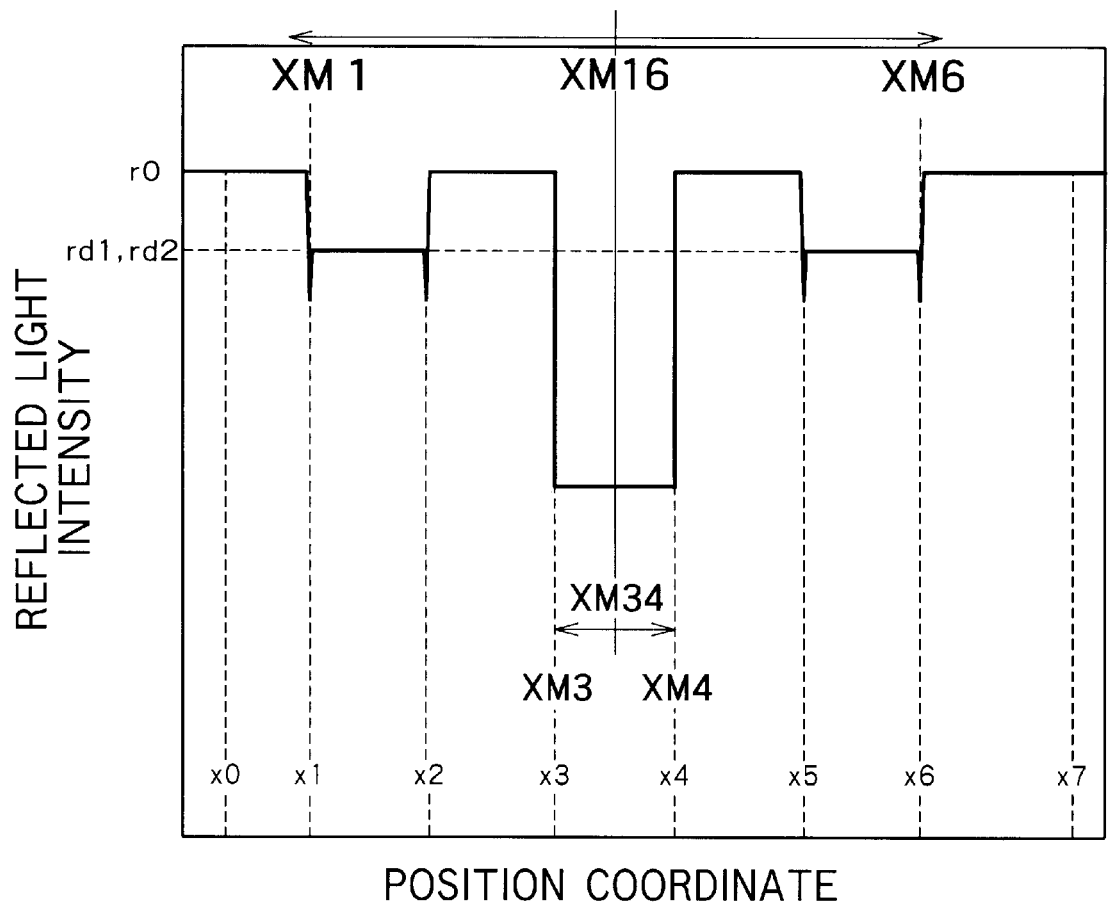
FIG. 4 is a schematic diagram showing a waveform for explaining the slice level method.
Figure 5:
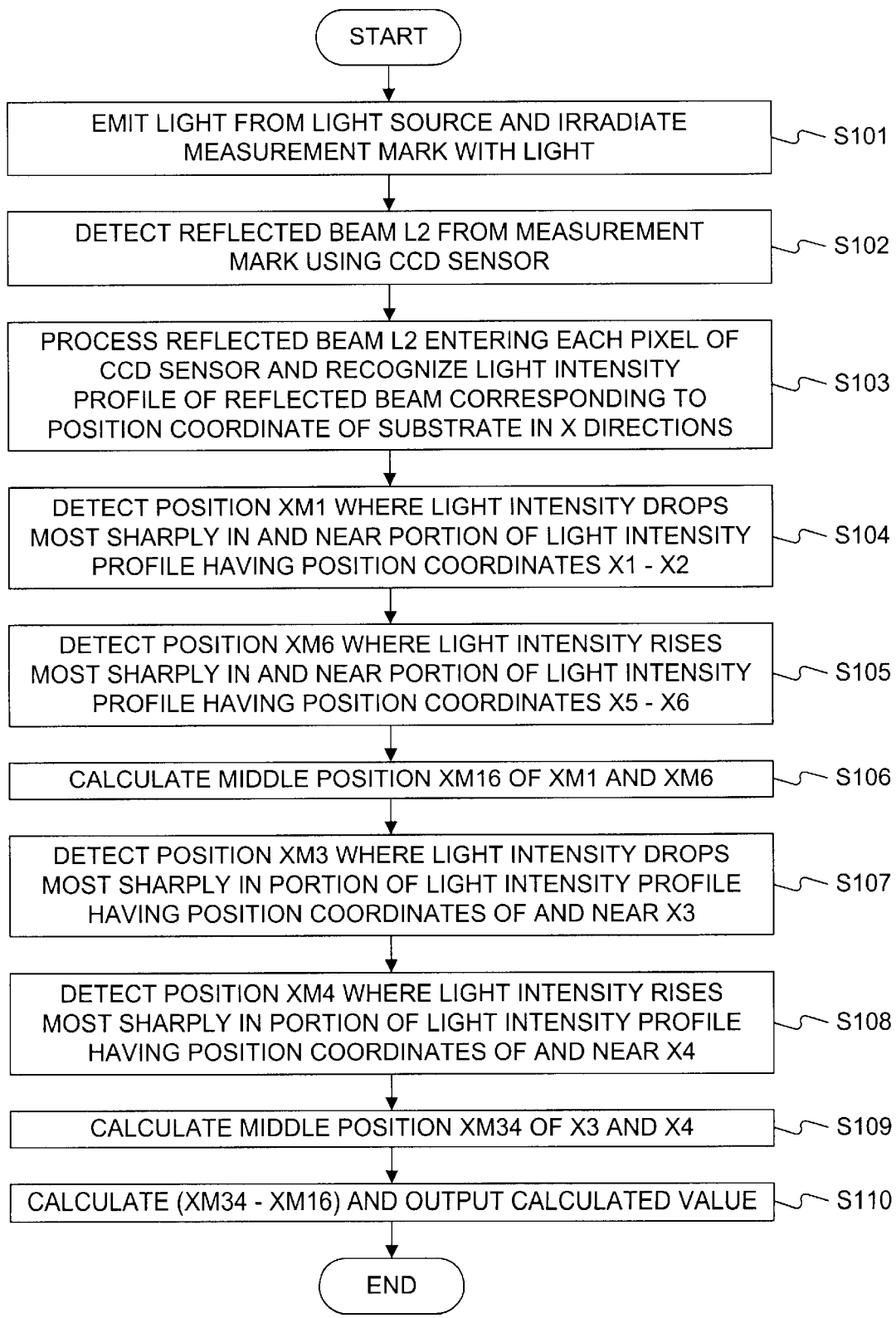
FIG. 5 is a flow chart for explaining the slice level method.
Figure 6:
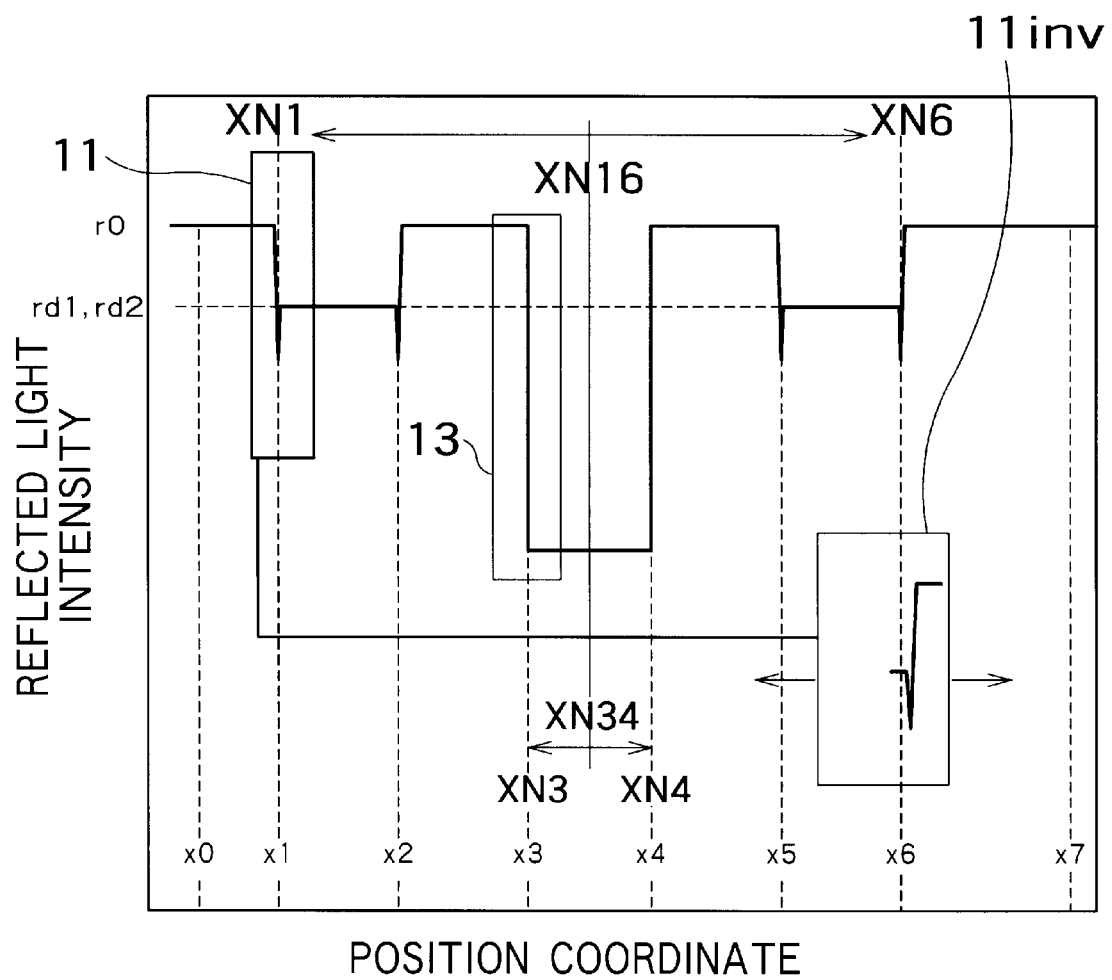
FIG. 6 is a schematic diagram showing a waveform for explaining the correlation method.
Figure 16A:
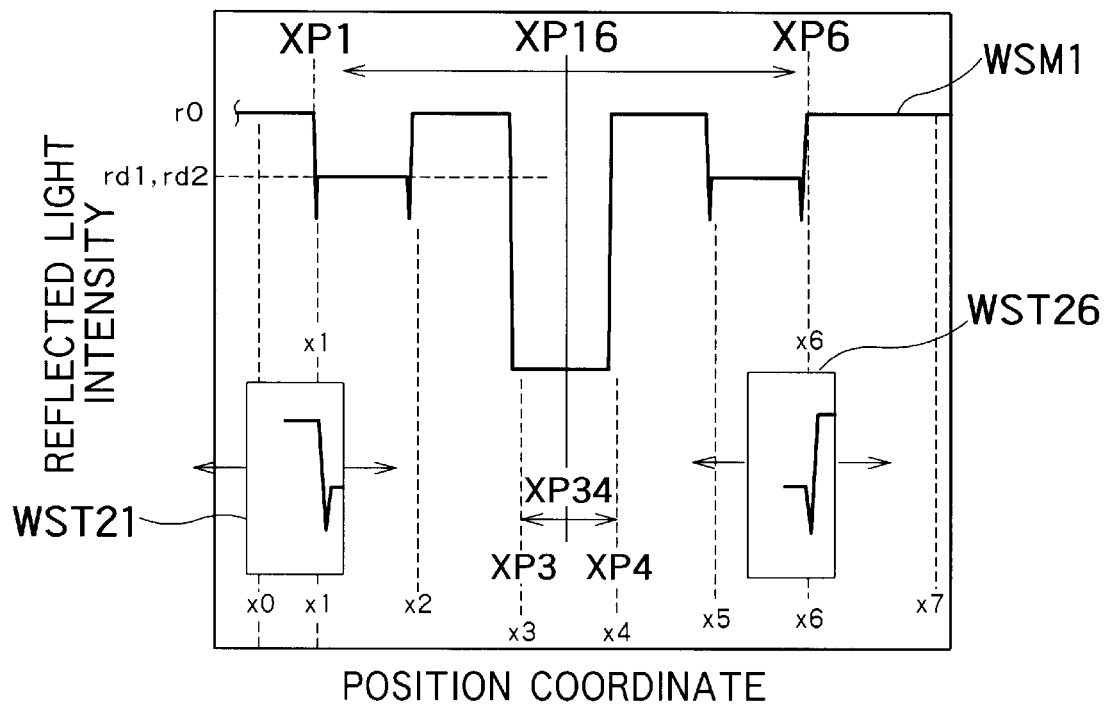
FIGS. 16A and 16B are diagrams showing examples of measured waveforms obtained at steps shown in FIGS. 14 and 15.

An example of the measured waveform WSM1 obtained at the above mentioned steps S41 through S43 is shown in FIG. 16A. Like the waveform shown in FIG. 4, the measured waveform in FIG. 16A has a symmetrical shape with respect to a line passing through the center of the SiN layer 27 and perpendicular to the substrate 120 in cross sectional view of the measurement mark 20. A method for detecting a mark position using the symmetrical waveform WSM1 is described below referring to flow charts of FIGS. 14 and 15, and FIG. 16A. For a simplified explanation, in FIGS. 14 and 15, a film thickness is designated by Tj (J=1, 2), a depth is designated by Dk (k=1, 2) and a position coordinate of the measurement mark by Xl, Xm (l, m=1 to 6).

First, as shown in FIG. 14, a theoretical waveform is prepared by simulation to detect a position on the measured waveform diagram corresponding to a position coordinate X1.

That is, j=1, k=1, l=1 and m=2 are set (step S44), a film thickness T1 and a depth D1 of a step are inputted into the theoretical waveform preparation part 57 in the control computer 50 as parameters. In this preferred embodiment T1=1 $\mu$m and D1=0.1 $\mu$m are inputted. The theoretical waveform preparation part 57 calculates light strength of the reflected beam which is expected to be generated at and near the position coordinate X1 on the basis of the inputted parameters to prepare a theoretical waveform WST21 as shown in FIG. 16A and supplies the theoretical waveform WST21 to the waveform comparison part 53 (step 45 in FIG. 14).

The waveform comparison part 53 then compares the measured waveform WSM1 with the theoretical waveform WST21, detects a portion of the measured waveform WSM1 which has position coordinates from X1 to X2 and near thereto and is most similar to the theoretical waveform WST21. The waveform comparison part 53 further detects a position coordinate XP1 corresponding to the point at which the strength of the reflected light drops (step S46 in FIG. 14)

and supplies the information on the XP1 to the misalignment operation part 55.

Next, at the same steps as the above-mentioned steps the waveform comparison part 53 detects a position XP6 on the measured waveform corresponding to a position coordinate X6 (steps S47, S48, S45 and S46). That is, j=1, k=2, l=6 and m=5 are set (step S48), T1=1 µm and D2 (=D1)=0.12 µm are inputted to the theoretical waveform preparation part 57 as parameters. The theoretical waveform preparation part 57 prepares a theoretical waveform WST26 of X6 and position coordinates in the vicinity of X6 (step S45). The waveform comparison part 53 then detects the position coordinate XP6 of the portion of the measured waveform WSM1 which has position coordinates from X6 to X5 and near thereto and is most similar to the theoretical waveform WST26 (step S46). The waveform comparison part 53 then supplies the information on the XP6 to the misalignment operation part 55.

After XP1 and XP6 are detected (step S47), as shown in FIG. 15, the misalignment operation part 55 calculates the middle point XP16 of XP1 and XP6 (step S49).

Then, XP3 and XP4 corresponding to position coordinates X3 and X4 respectively are detected, meanwhile X3 and X4 are the position of the outside edges of the SiN layer 27 respectively. These steps are substantially the same as the above-mentioned steps S45 and S46.

In more specific, as shown in FIG. 15, j=1, k=2, l=3 and m=4 are set (step S51) and the film thickness Ti of the $SiO_2$ layer 23 and the film thickness of SiN film T2 are inputted to the theoretical waveform preparation part 57 as parameters. The theoretical waveform preparation part 57 calculates light strength of a reflected beam which is expected to be obtained at and near the position coordinate X3 to prepare a theoretical waveform WST23 (step S52). In this preferred embodiment T2 is 1 µm.

The waveform comparison part 53 then detects the position coordinate XP3 of the portion of the measured waveform WSM1 which has the position coordinates from X3 to X4 and near thereto and is most similar to the theoretical waveform WST23 (step S53).

At similar steps, with respect to XP4 (step S54), j=1, k=2, l=4 and m=3 are set (step S55), XP4 is detected at above-mentioned steps and the detected result is supplied to the misalignment operation part 55.

The misalignment operation part 55 first calculates the middle point XP34 of XP3 and XP4 (step S56) and further calculates the difference between the middle point XP16 obtained at the step S49 and the middle point XP34, i.e. (XP16−XP34) to output the calculated value as misalignment "0".

As described above, when the misalignment measurement mark having a symmetric cross sectional shape is to be detected in this preferred embodiment, a theoretical waveform corresponding to a surface region which changes in shape, such as WST21 and WST26 is prepared and the position coordinates XP1 and XP2 of a portion of the measured waveform, which portion is most similar to the theoretical waveform respectively, is acquired. Each of the position coordinates XP1 and XP6 thus accurately coincides with the wafer position coordinates X1 and X6 of the measurement mark respectively as long as the theoretical waveforms WST21 and WST26 are exactly prepared. Since XP16 precisely coincides with the middle point of that of the wafer position coordinates X1 and X6, the misalignment measurement mark can be accurately detected in the preferred embodiment.

(b) When Cross Sectional Shape Of Measurement Mark Is Non-Symmetric

Next, steps of detecting a measurement mark when a cross sectional shape thereof is non-symmetric will be described below referring to FIGS. 14, 15 and 16B. The mark 21 shown in FIG. 7 will be used as an object to be measured. Then, the film thickness T1=T2=1 µm, the depth D1'=0.1 µm of the first concavity and the depth D2'=0.14 µm of the second concavity are measured at step S41 shown in FIG. 14 and values thereof are inputted to the theoretical waveform preparing part 57.

Figure 16B:
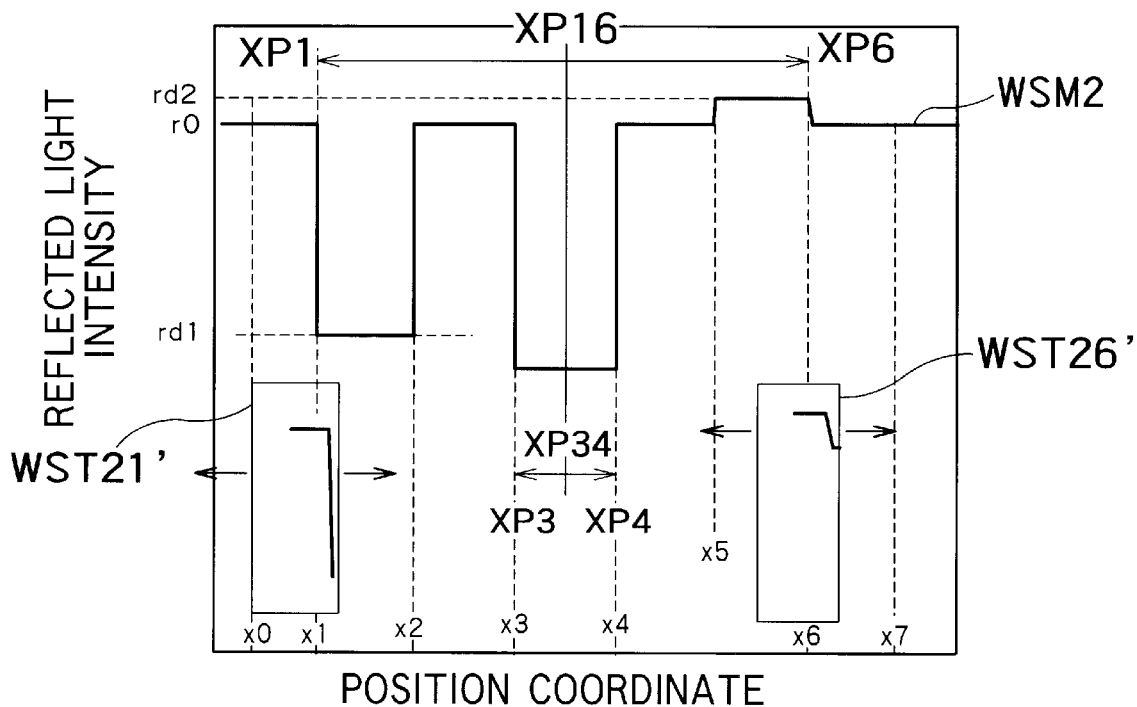

FIG. 16B shows an example of a measured waveform WSM2 obtained at the above mentioned steps S41 through S43. As mentioned earlier, the measured waveform WSM2 has a non-symmetrical shape with respect to a line passing through the center of the SiN layer 27 and perpendicular to the substrate 120 in cross sectional view of the measurement mark 21.

First, as shown in FIG. 14, a theoretical waveform which is expected to be obtained from position coordinates of and near X1 is prepared to detect a position on the measured waveform diagram corresponding to the position coordinate X1. That is, j=1, k=1, l=1 and m=2 are set (step S44), the film thickness T1=1 µm and the depth D1'=0.1 µm of the step are inputted to the theoretical waveform preparation part 57 in the control computer 50 as parameters. The theoretical waveform preparation part 57 calculates light strength of a reflected beam which is expected to be generated at and near the position coordinate X1 to prepare a theoretical waveform WST21' as shown in FIG. 16B (step 45).

The waveform comparison part 53 then compares the measured waveform WSM1 with the theoretical waveform WST21', detects a portion of the measured waveform WSM1 which has the position coordinates from X1 to X2 and near thereto and is most similar to the theoretical waveform WST21'. The waveform comparison part 53 further detects the position coordinate XP1 corresponding to the point at which strength of the reflected light drops (step S46 in FIG. 14) and supplies the information on the XP1 to the misalignment operation part 55.

Next, at the same steps as the above-mentioned steps a theoretical waveform which would be obtained on a reflected beam from the region having position coordinates of and near X6 and the position XP6 on the measured waveform corresponding to X6 is detected (steps S47, S48, S45 and S46). That is, j=1, k=2, l=6 and m=5 are set (step S48), T1=1 µm and D2' (≠D1')=0.14 µm are inputted to the theoretical waveform preparation part 57 as parameters. The theoretical waveform preparation part 57 prepares a theoretical waveform WST26' of and near X6 (step S45). The waveform comparison part 53 then detects the position coordinate XP6 of the portion of the measured waveform WSM2 which has the position coordinates from X6 to X5 and near thereto and is most similar to the theoretical waveform WST26' (step S46). The waveform comparison part 53 then supplies the detected result to the misalignment operation part 55.

After XP1 and XP6 are detected (step S47), as shown in FIG. 15, the misalignment operation part 55 calculates the middle point XP16 of XP1 and XP6 (step S49).

Then, XP3 and XP4 corresponding to the position coordinates X3 and X4 respectively are detected, meanwhile X3 and X4 are the position of the outside edges of the SiN layer 27 respectively.

In more specific, as shown in FIG. 15, j=1, k=2, l=3 and m=4 are set (step S51) and the film thickness T1=1 µm of the $SiO_2$ layer 23 and the film thickness of SiN layer T2=1 µm are inputted to the theoretical waveform preparation part 57 as parameters. The theoretical waveform preparation part 57 calculates light strength of a reflected beam which is expected to be obtained at and near the position coordinate X3 to prepare the theoretical waveform WST23' (step S52).

The waveform comparison part 53 then detects the position coordinate XP3 of the portion of the measured waveform WSM1 which has the position coordinates from X3 to X4 and near thereto and is most similar to the theoretical waveform WST23' (step S53).

At similar steps, with respect to XP4 (step S54), j=1, k=2, l=4 and m=3 are set (step S55), XP4 is detected at abovementioned steps S52 and S53, and the detected result is supplied to the misalignment operation part 55.

The misalignment operation part 55 first calculates the middle point XP34 of XP3 and XP4 (step S56) and further calculates the difference between the middle point XP16 obtained at the step S49 and the middle point XP34, i.e. (XP16−XP34) to output the calculated value as misalignment "0".

In the present embodiment as described above, a theoretical waveform corresponding to a surface region which changes in shape is prepared and the position coordinates in a portion of the measured waveform WSM, such as XP1 and XP2, which portion is most similar to the theoretical waveform, is acquired. For this reason the position coordinates XP1 and XP6 accurately coincide with the wafer position coordinate X1 and X6 of the measurement mark respectively as long as the theoretical waveform is exactly prepared.

As mentioned above in specific, according to the present embodiment a misalignment measurement mark can be accurately detected whether a shape of measured waveform mark is symmetric or non-symmetric.

(2) Second Preferred Embodiment

Referring to the accompanied drawings the second preferred embodiment of the present invention will be described below.

Figure 17:
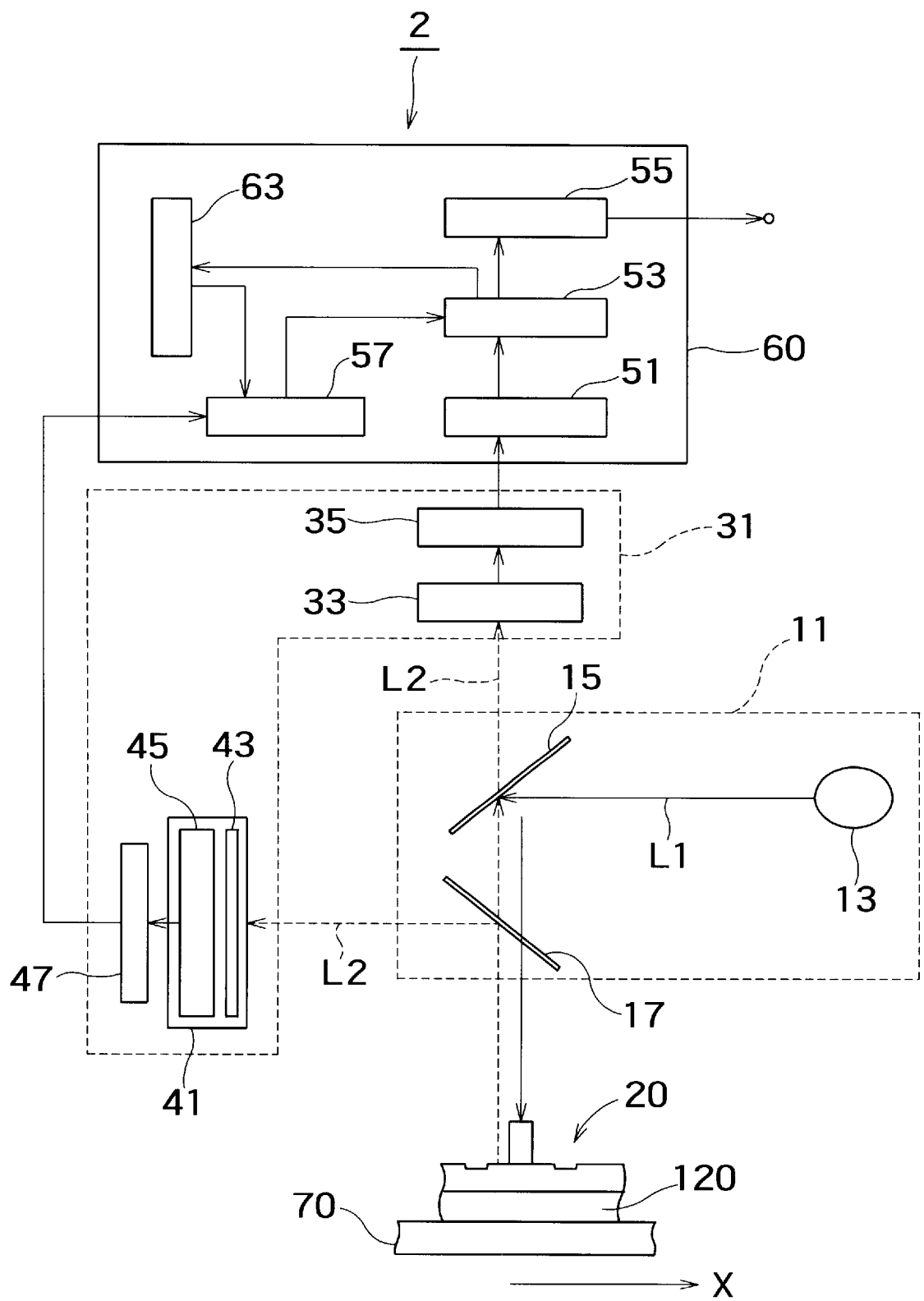
FIG. 17 is a schematic diagram showing the construction of the second embodiment of the mark position detecting system according to the present invention.

FIG. 17 is a schematic diagram showing the construction of the second embodiment of a mark position detecting system according to the present invention. As shown in this figure, the mark position detecting system 2 of the present embodiment is characterized in that the system further comprises a shape information acquiring part for measuring the film thickness T1, T2 and the depths D1, D2 of the concavities which are parameters used for detecting the measurement mark.

As can be seen in comparison with FIG. 12, the illumination optical system 11 of the mark position detecting system 2 further includes a half mirror 17. In addition, a detection optical system 31 further includes a spectroscope 41 and an A/D converter 47. Furthermore, a control computer 60 further includes parameter calculation part 63. These additional component parts constitute the shape information acquiring part. Other components of the mark position detecting system 2 of this preferred embodiment are substantially the same as the mark measurement detecting system 1 shown in FIG. 12.

The spectroscope 41 has a diffraction grating 43 and a CCD sensor 45. A reflected beam of light from the measurement mark travels through the half mirror 17 to be incident on the diffraction grating 43. The incident beam of light is broken up into rays having arbitrary wavelengths by the diffraction grating 43 to be incident on a pixel part of the CCD sensor 45.

Charges generated in each pixel of the pixel part of the CCD sensor 45 are outputted as an analogue signal. The analogue signal is supplied to the A/D converter 47 to be converted to a digital signal. The converted digital signal is supplied to the control computer 60 as a signal decoding to strength of each ray having each wavelength separated from the reflected beam.

Referring now to FIGS. 18 through 22A and 22B, as a preferred second embodiment of a mark position detecting method according to the present invention, the operation of the mark position detecting system 2 of this embodiment will be described below.

Figure 18:
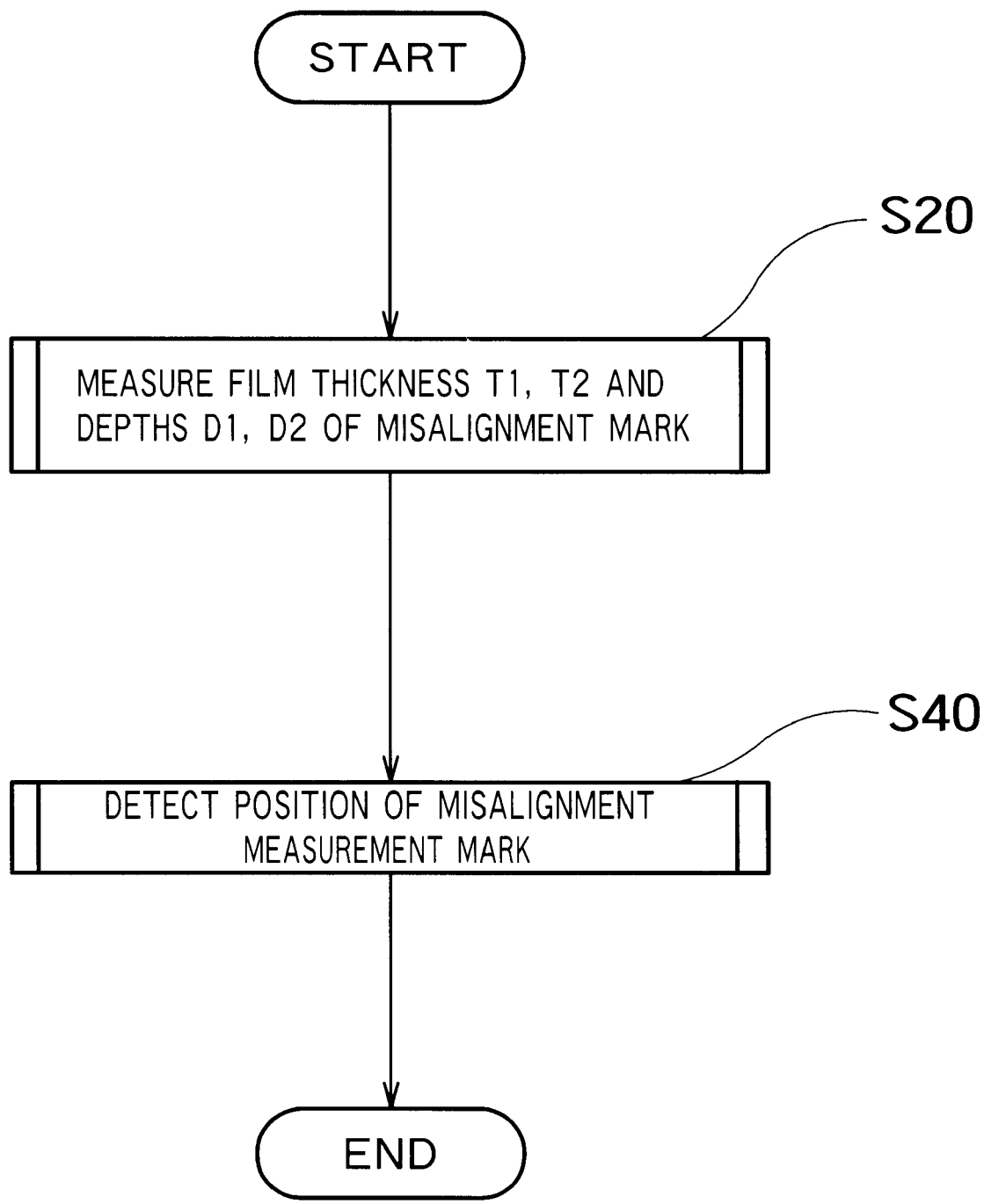
FIG. 18 is an overview flow chart for explaining the mark position detecting method in the second embodiment of a method for detecting a mark position according to the invention.
Figure 19:
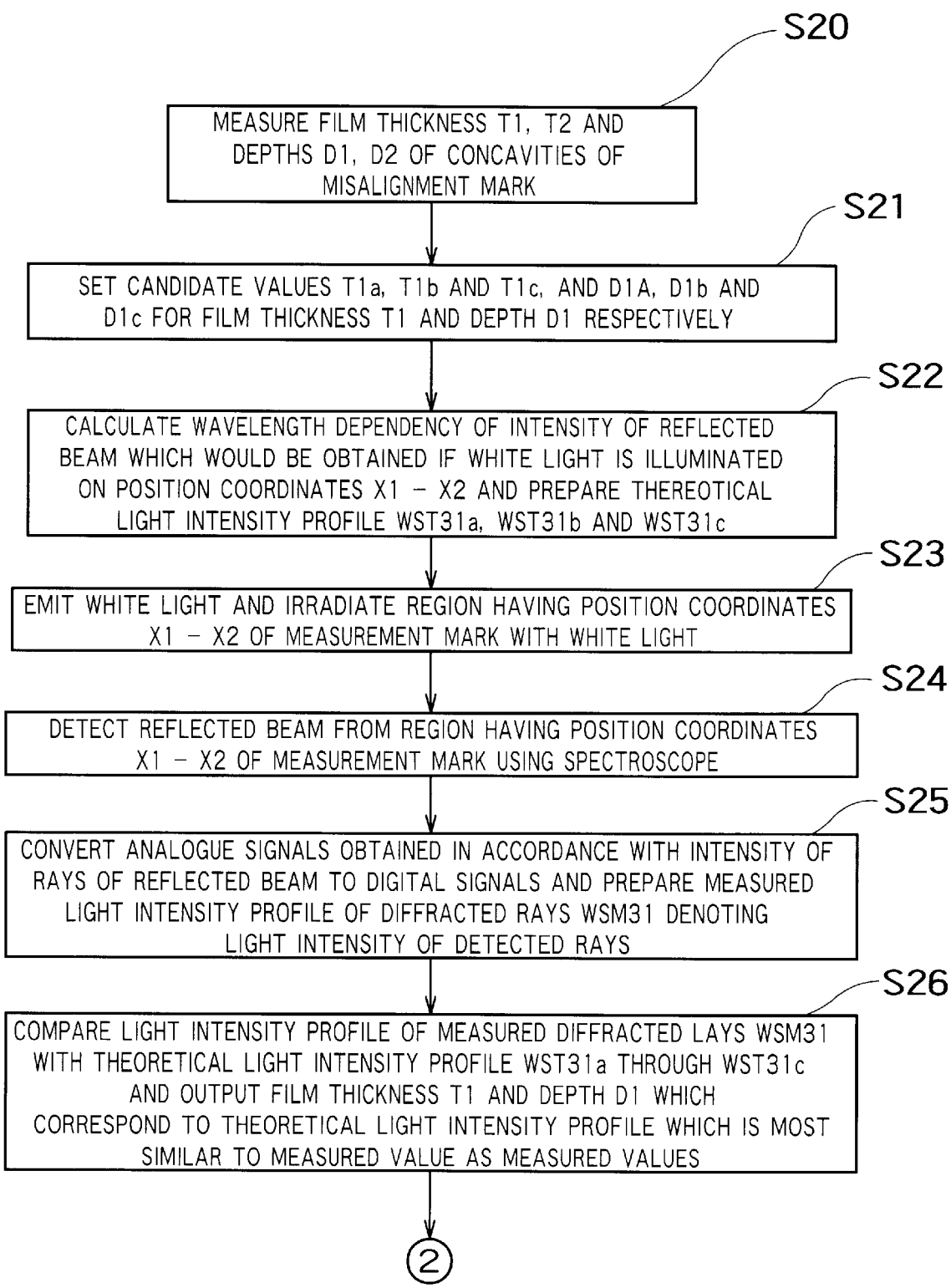
FIGS. 19 through 21 are flow charts for explaining the mark position detecting method in the second embodiment of a method for detecting a mark position according to the invention.
Figure 20:
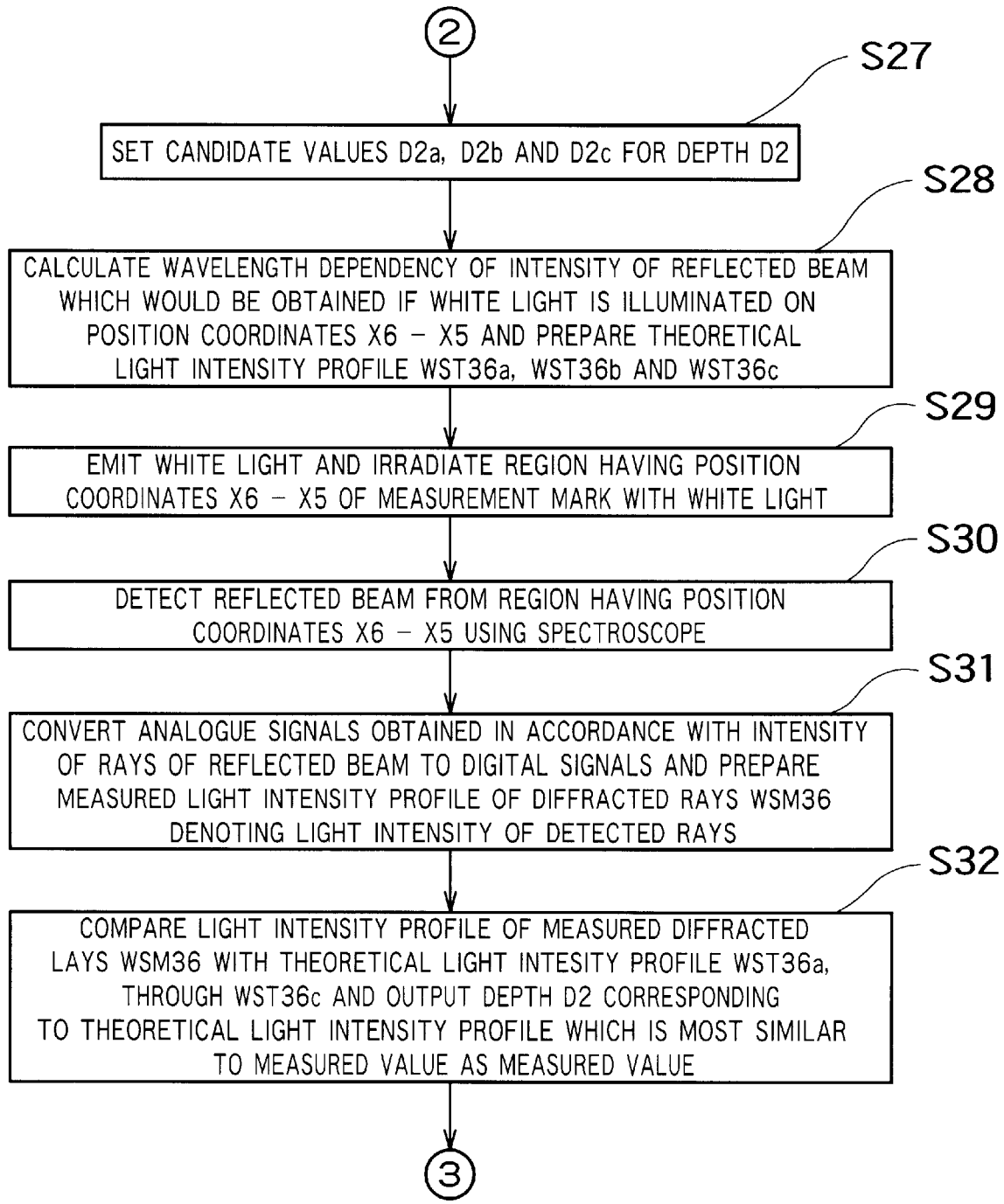
Figure 21:
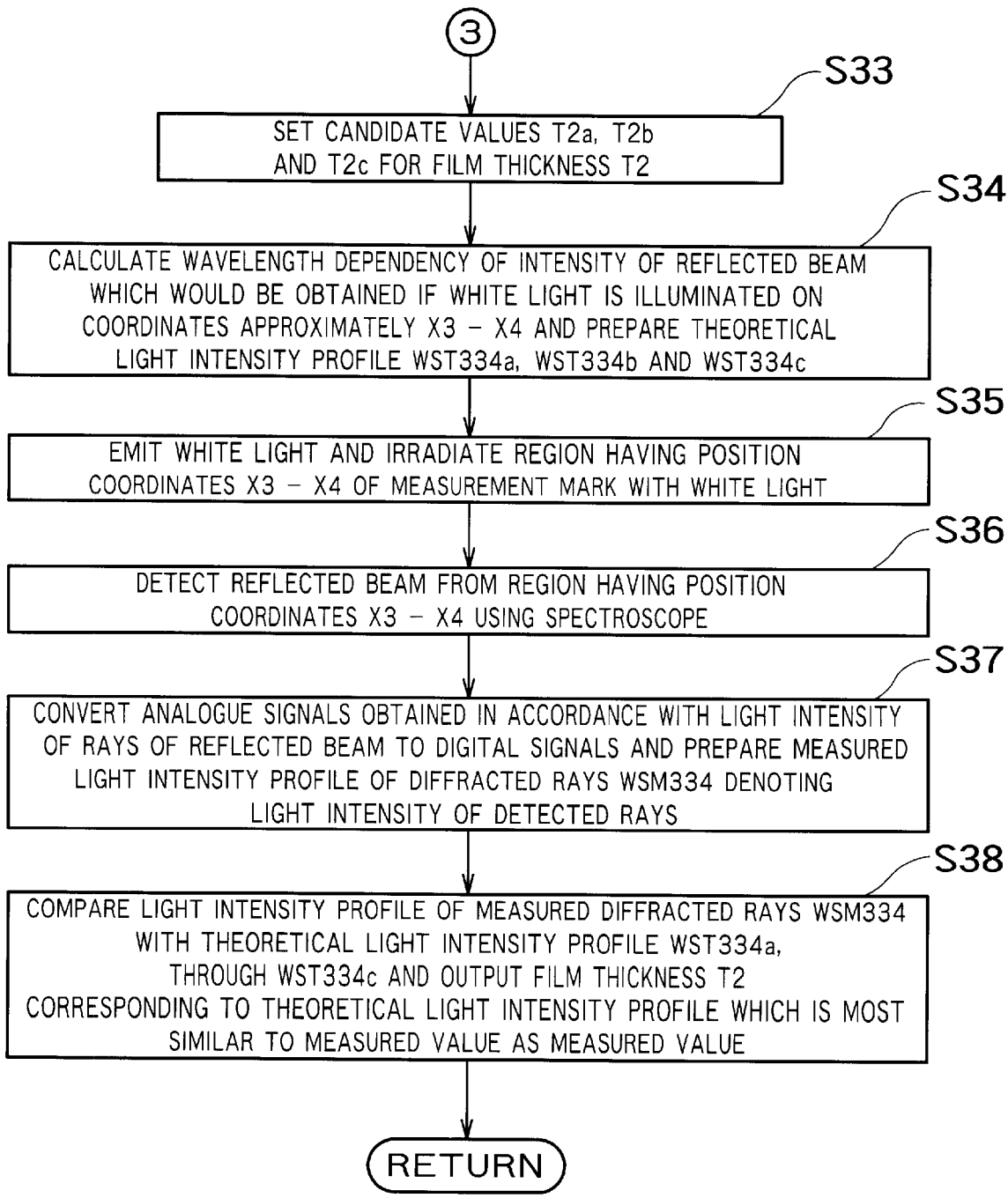

FIGS. 18 through 21 are flow charts for explaining the mark position detecting method of the preferred second embodiment. FIG. 18 is an overview flow chart for explaining the mark position detecting method and FIGS. 19 through 21 are flow charts for explaining a step S20 of the FIG. 18 in more specific.

As shown in FIG. 18, the present embodiment is characterized in that the method includes a step of calculating a parameter as a preparation step (step S20) prior to a misalignment measurement mark position detecting step (step S40) as the main step. Parameters used in this embodiment are the film thickness T1, T2 of the measurement mark and the depths D1, D2 of the concavities shown in FIG. 2 or FIG. 7. Information on materials constructing each thin film is previously stored in a memory (not shown) of the control computer 60. Since the misalignment measurement mark position detecting step (step S40) as a main step is the same as the steps shown in FIGS. 13 through 15, the preparation step will be described in detail below with an example of the non-symmetric measurement mark 21. The flow chart of FIG. 19 shows steps of calculating the film thickness T1 and the depth D1, and the flow chart of FIG. 20 shows steps of calculating the depth D2. In addition, the flow chart of FIG. 21 shows steps of calculating the film thickness T2.

First, as shown in FIG. 19, the parameter calculation part 63 in the control computer 60 sets values T1a, T1b and T1c, and D1a, D1b and D1 as candidate values for film thickness T1 and depth D1 respectively, and supplies these candidate values to the theoretical waveform preparation part 57 (step S21).

The theoretical waveform preparation part 57 extracts information on the materials of the $SiO_2$ layer 23 and SiN layer 27 from the memory (not shown). The theoretical waveform preparation part 57 calculates wavelength dependency of strength of the reflected beam by means of simulation, which would be obtained if the first concavity (position coordinates X1 to X2) of the measurement mark is illuminated with the white light, on the basis of the extracted information and the supplied parameters. The theoretical waveform preparation part 57 then prepares theoretical waveforms WST31a, WST31b and WST31c which correspond to each of the candidate values T1a and D1a, T1b and D1b, and T1c and D1c as shown in FIG. 22A (step S22).

Next, light having wavelength of λ, in this preferred embodiment white light L1 is emitted from the light source 13 to irradiate the first concavity (position coordinates X1 to X2) of the measurement mark via the half mirror 15 such as pointed by an arrowhead L1a shown in FIG. 2 (step S23). The reflected beam of light enters the spectroscope 41 via the half mirror 17 and diffracted by the diffraction grating 43 into rays having predetermined wavelengths respectively. The diffracted rays are incident on the pixel part of the CCD sensor 45 and electric charges in accordance with strength of each of the diffracted rays are generated every diffracted ray in each pixel and a signal of the charges are outputted (step S24). In this embodiment wavelengths of the diffracted rays are set as 600 nm, 650 nm, 700 nm, 750 nm and 800 nm and the strength of these rays are measured. Signals of the charges generated in the CCD sensor 45 are converted to digital signals by the A/D converter 47 to be supplied to the theoretical waveform preparing part 57. The theoretical waveform preparing part 57 prepares a measured waveform of the diffracted rays WSM31 denoting wavelength dependency of the reflected rays on the basis of the signals supplied from the A/D converter 47. In the example shown in FIG. 22A, for simple explanation, the measured value of the strength of each ray wavelength is calculated to be plotted in a theoretical waveform diagram which is previously prepared at the above mentioned step 22. The theoretical waveform preparing part 57 supplies information on the prepared waveform of the measured diffracted rays to the waveform comparison part 53 (step S25).

Figure 22A:
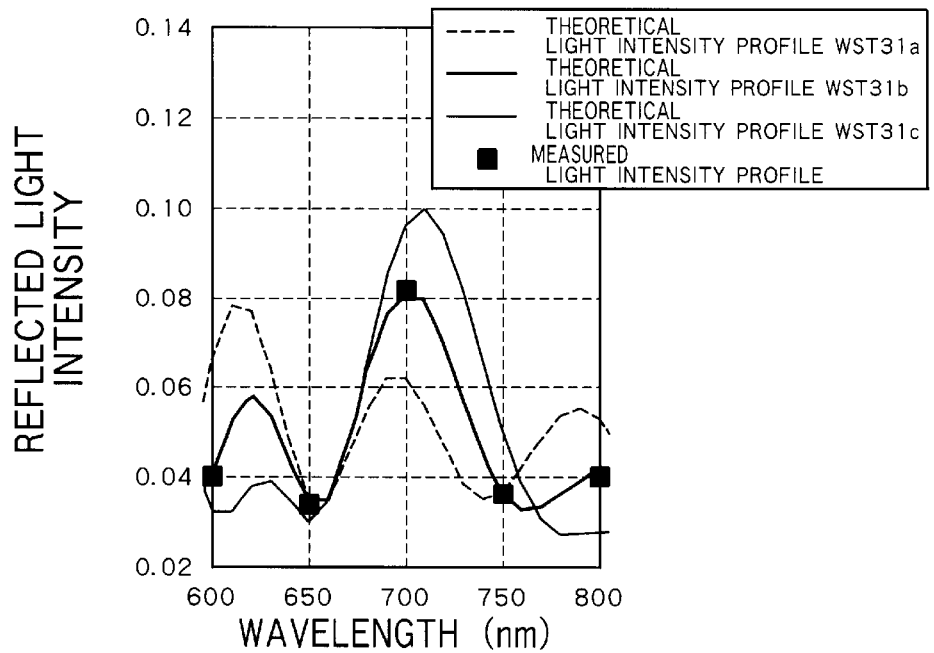
FIGS. 22A and 22B are diagrams showing waveforms of diffracted rays of reflected beam denoting wavelength dependency of the reflected beam from a measurement mark.

The waveform comparison part 53 compares the waveform of the measured diffracted rays (measured values of each wavelength of the rays of reflected beam in the example shown in FIG. 22A) with the theoretical waveform, select the waveform which is most similar to the waveform of the measured diffracted rays (measured values), of the theoretical waveforms WST31a, WST31b and WST31c. The waveform comparison part 53 supplies information on the selected waveform to the parameter calculation part 63. In the example shown in FIG. 22A the theoretical waveform WST31b is selected.

A specific method for comparing the measured waveform of the diffracted rays with the theoretical waveform is described below.

That is, the ray strength of the theoretical waveform in each wavelength are assumed as a ($\lambda$), b ($\lambda$) and c ($\lambda$), and the ray strength of the measured diffracted rays in each wavelength are assumed as Y ($\lambda$).

Then, the total sum of the absolute values of the difference between the ray strength in the theoretical waveforms and the strength of the ray of the reflected beam which are measured, that is, $$\Sigma|Y(\lambda)-a(\lambda)|, \Sigma|Y(\lambda)-b(\lambda)|, \Sigma|Y(\lambda)-c(\lambda)| \quad (3)$$

is calculated and the theoretical waveform which gives the minimum value according to the formula (3) is selected as a theoretical waveform which is most similar to the measured diffracted waveform (measured value).

The parameter calculation part 63 selects the film thickness T1 and the depth D1 which correspond to the values of the theoretical waveform WST31b on the basis of the information on the theoretical waveform WST31b supplied from the waveform comparing part 53 as parameters to supply the values to the theoretical waveform preparing part 57 (step S26). In the example shown in FIG. 22A T1=1 $\mu$m and D1=0.1 $\mu$m are selected.

Then, the mark position detecting system 2 measures the depth D2 of the concavity C2 of the measurement mark.

That is, as shown in FIG. 20, the parameter calculation part 63 sets values D2a, D2b and D2c as candidate values for depth D2, and supplies these candidate values to the theoretical waveform preparation part 57 (step S27).

The theoretical waveform preparation part 57 extracts information on the materials of the SiO$_2$ layer 23 from the memory (not shown). The theoretical waveform preparation part 57 calculates wavelength dependency of strength of a reflected beam by means of simulation, which would be obtained if the concavity (position coordinates X6 to X5) of the measurement mark is illuminated with the white light, on the basis of the extracted information and the supplied values as parameters. The theoretical waveform preparation part 57 then prepares theoretical waveforms WST36a, WST36b and WST36c as shown in FIG. 22B (step S28).

Next, white light L1 is emitted from the light source 13 to irradiate the concavity (position coordinates X6 to X5) of the measurement mark via the half mirror 15 such as pointed by the arrowhead L1a shown in FIG. 2 (step S29 in FIG. 20). A reflected beam of light enters the spectroscope 41 via the half mirror 17 and diffracted by the diffraction grating 43 into rays having predetermined wavelengths respectively. The diffracted rays are detected by the CCD sensor 45 and from the CCD sensor 45 signals from electric charges in accordance with strength of each of the diffracted rays are outputted (step S30). As is the case with the concavity C1, set wavelengths for measurement are 600 nm, 650 nm, 700 nm, 750 nm and 800 nm. The signals outputted from the CCD sensor 45 are converted to digital signals by the A/D converter 47. The theoretical waveform preparing part 57 in the control computer 60 prepares a measured waveform of the diffracted rays WSM36 denoting wavelength dependency of the reflected rays on the basis of the signals supplied from the A/D converter 47. In an example shown in FIG. 22B the measured value of the strength of each ray wavelength is calculated to be plotted in a theoretical waveform diagram which is previously prepared at the above mentioned step 28. The theoretical waveform preparing part 57 supplies information on the prepared waveform of the measured diffracted rays to the waveform comparison part 53 (step S31).

Figure 22B:
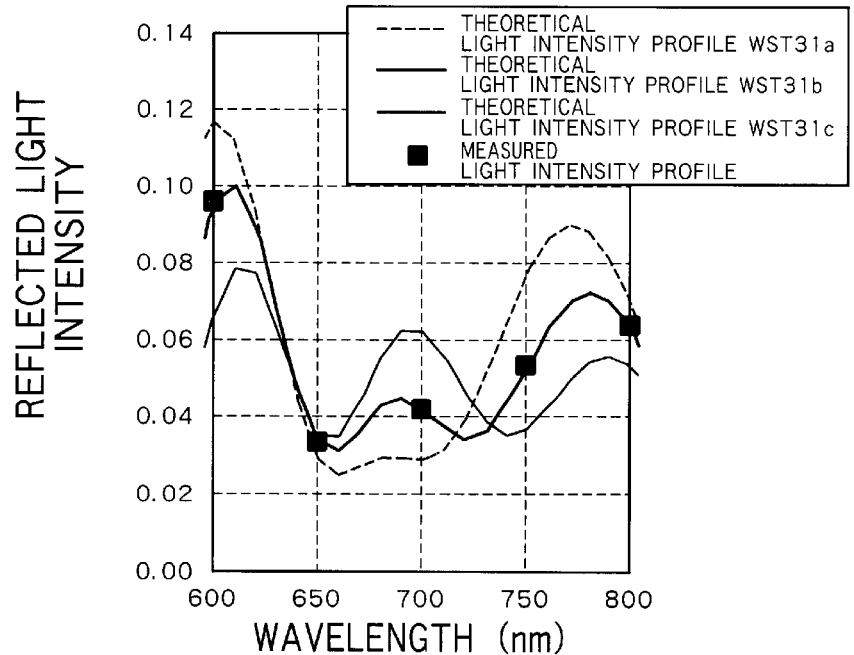

The waveform comparison part 53 compares the waveform of the measured diffracted rays (measured values of each wavelength of the rays of the reflected beam in the example shown in FIG. 22B) with the theoretical waveforms WST36a, WST36b and WST36c, select the waveform which is most similar to the waveform of the measured diffracted rays (measured values), of the theoretical waveforms. The waveform comparison part 53 supplies information on the selected waveform to the parameter calculation part 63. In the example shown in FIG. 22B the theoretical waveform WST36b is selected.

The parameter calculation part 63 selects the depth D2 corresponding to the theoretical waveform WST36b supplied from the waveform comparing part 53 as a parameter to supply the values to the theoretical waveform preparing part 57 (step S32). In the example shown in FIG. 22B D2=0.14 $\mu$m is selected.

Finally, the film thickness T2 of the SiN film is calculated at steps similar to the above mentioned steps S27 through S32 to be supplied to the theoretical waveform preparing part 57 as parameters. FIG. 21 is a flow chart showing the steps of calculating the film thickness T2. Explanation for steps shown in FIG. 21 is here omitted because the step numbers of FIG. 21 are substantially the same as those added by 6 to steps in FIG. 20 except that the parameter as an object to be measured is T2, that the theoretical waveforms are WST334a through WST334c and that the position coordinates are X3 to X4.

Obtaining necessary parameters in the above mentioned pre-process, the mark position detecting system 2 detects the position of the measurement mark using these parameters at the same steps as those of the first preferred embodiment described earlier.

Thus, in the preferred embodiment, a measurement mark can precisely detected whether the cross sectional shape of the mark is symmetric or non-symmetric. Moreover, parameters which are required for detecting a position of a measurement mark are acquired with the spectroscope 41. Therefore, a series of steps from the step of acquiring parameters to the step of detecting the position of the measurement mark can be executed using a single system.

In the present embodiment, a mark position detecting system capable of analyzing wavelength dependency of reflected light is described, which comprises a CCD sensor and an A/D converter other than the CCD sensor 33 and the A/D converter 35 for recognizing strength distribution of reflected light. It is more advantageous, however, that a mark position detecting system may comprise a mechanism which is movable in a horizontal plane above the stage 70 and has a diffraction grating 43 arranged thereon and is moved to the region between the half mirror 15 and the CCD sensor 33 in a preparation stage so that reflected light is diffracted without passing through the half mirror 17 and then moved out of the region so that the reflected light is directly incident on the CCD sensor 33 in the main process.

While some preferred embodiments of the present invention have been described, the present invention should not be limited to the above-described embodiments, but the invention can be embodied in various ways without departing from the scope of the invention. Therefore, the invention should be understood to include all possible embodiments and modification to the shown embodiments which can be embodied without departing from the principle of the invention according to the appended claims.

What is claimed is:

1. A mark position detecting system comprising:
   a light emitter for emitting light to irradiate a mark for misalignment measurement, the mark being formed on a semiconductor substrate, shape information of the mark and material information of an element constituting the mark being previously given;
   a light detector for detecting a reflected beam of light emitted from the mark on irradiation of the light;
   a light intensity profile recognition part for preparing a measured light intensity profile on the basis of the detected result of said light detector, the measured light intensity profile denoting light intensity of said reflected beam according to the shape and the material of the mark;
   a theoretical light intensity profile preparing part for preparing a theoretical reflected beam light intensity profile on the basis of said shape information and said material information of the mark, said theoretical reflected beam light intensity profile denoting theoretical light intensity of said reflected beam which would be obtained by irradiating a desired region of the mark with the light; and
   a determining part for comparing said measured light intensity profile with said theoretical reflected beam light intensity profile to acquire positional information on a place on a surface of the substrate, the place corresponding to the portion of said measured light intensity profile which is most similar to said theoretical reflected beam light intensity profile and for detecting the position of the mark on the basis of the acquired positional information.

2. A mark position detecting system according to claim 1, wherein said theoretical light intensity profile preparing part prepares said theoretical reflected beam light intensity profile of a spot at which intensity of said reflected beam changes.

3. A mark position detecting system according to claim 2, wherein the mark includes a first thin film formed of a first material on the substrate and a second thin film formed of a second material on the first film so as to protrude from the first film, the first thin film being provided thereon with a first concavity having a first depth and a second concavity having a second depth, the first concavity and the second concavity being spaced from each other, and, the second thin film being arranged in the middle of the first and second concavities,
   said shape information includes step information concerning a thickness of the first thin film, a thickness of the second thin film, the first depth and the second depth,
   said theoretical light intensity profile preparing part prepares first through a fourth theoretical reflected beam light intensity profiles, the first theoretical reflected beam light intensity profile corresponding to a first place equivalent to an outside edge of the first concavity in view of the second thin film, the second theoretical reflected beam light intensity profile corresponding to a second place equivalent to an outside edge of the second concavity in view of the second thin film, the third theoretical reflected beam light intensity profile corresponding to a third place equivalent to a first sidewall of the second thin film and the fourth theoretical reflected beam light intensity profiles corresponding to a fourth place equivalent to a second sidewall of the second thin film, the second sidewall facing the first sidewall, and
   said determining part compares the measured light intensity profile with the first through fourth theoretical reflected beam light intensity profiles respectively, calculates a first middle point position which is the middle point of a first edge position corresponding to the first place and a second edge position corresponding to the second place, calculates a second middle point which is the middle point of the first sidewall position corresponding to the third place and the second sidewall position corresponding to the fourth place, and determines whether any alignment occurs between said first middle point and said second middle point.

4. A mark position detecting system comprising:
   a light emitter for emitting light to irradiate a mark for misalignment measurement, the mark being formed on a semiconductor substrate, material information of an element constituting a surface portion of the mark being previously given;
   a spectroscope for diffracting a reflected beam of light into a ray having an arbitrary wavelength, said reflected beam being emitted from the mark on irradiation by the light;
   a first light detector for detecting the diffracted ray diffracted by said spectroscope;
   a shape information acquiring part for receiving the detected result of said first light detector and said material information, recognizing a measured diffracted ray light intensity profile denoting light intensity of said diffracted ray according to the shape and the material of the mark and for acquiring shape information of the mark by analyzing said measured diffracted ray light intensity profile;
   a second light detector for detecting said reflected beam, said reflected beam being emitted from said light emitter and reflected on the mark;
   a light intensity profile recognition part for preparing a measured light intensity profile on the basis of the detected result of said second light detector, the measured light intensity profile denoting light intensity of said reflected beam according to the shape and the material of the mark;
   a theoretical light intensity profile preparing part for preparing a theoretical diffracted ray light intensity profile which is a theoretical light intensity profile of said diffracted ray on the basis of said material information, for supplying said theoretical diffracted ray light intensity profile to said shape information acquiring part and for preparing a theoretical reflected beam light intensity profile on the basis of said shape information given from said shape information acquiring part and said material information, said theoretical reflected beam light intensity profile denoting theoretical light intensity of said reflected beam which would be obtained by irradiating a desired region of the mark with the light; and a determining part for comparing said measured light intensity profile with said theoretical reflected beam light intensity profile to acquire positional information on a place on a surface of the substrate, the place corresponding to the portion of said measured light intensity profile which is most similar to said theoretical reflected beam light intensity profile, and for detecting the position of the mark on the basis of the acquired said positional information.

5. A mark position detecting system according to claim 4, wherein said theoretical profile preparing part prepares said theoretical reflected beam light intensity profile of a spot at which intensity of said reflected beam changes.

6. A mark position detecting system according to claim 5, which further comprises a parameter calculating part for generating a plurality of parameters capable of being candidates for said shape information and for supplying said parameters to said shape information acquiring part, wherein said theoretical light intensity profile preparing part prepares said theoretical diffracted ray light intensity profile on the basis of said material information of every parameter, and said shape information acquiring part compares said measured diffracted ray light intensity profile with said theoretical diffracted ray light intensity profile of every parameter, selects said theoretical diffracted ray light intensity profile which is most similar to said measured diffracted ray light intensity profile of said theoretical diffracted ray light intensity profiles and determines the parameter of said selected theoretical diffracted ray light intensity profile as said shape information.

7. A mark position detecting system according to claim 6, wherein the mark includes a first thin film formed of a first material on the substrate and a second thin film formed of a second material on the first film so as to protrude from the first film, the first thin film being provided thereon with a first concavity having a first depth and a second concavity having a second depth, the first concavity and the second concavity are spaced from each other, and, the second thin film being arranged in the middle of the first and second concavities, said shape information includes step information concerning a thickness of the first thin film, a thickness of the second thin film, the first depth and the second depth, said theoretical light intensity profile preparing part prepares a first through a fourth theoretical reflected beam light intensity profiles, the first theoretical reflected beam light intensity profile corresponding to a first place equivalent to an outside edge of the first concavity in view of the second thin film, the second theoretical reflected beam light intensity profile corresponding to a second place equivalent to an outside edge of the second concavity in view of the second thin film, the third theoretical reflected beam light intensity profile corresponding to a third place equivalent to a first sidewall of the second thin film and the fourth theoretical reflected beam light intensity profile corresponding to a fourth place equivalent to a second sidewall of the second thin film, the second sidewall facing the first sidewall, and said determining part compares the measured light intensity profile with the first through fourth theoretical reflected beam light intensity profiles, respectively, calculates a first middle point position which is the middle point of a first edge position corresponding to the first place and a second edge position corresponding to the second place, calculates a second middle point which is the middle point of the first sidewall position corresponding to the third place and the second sidewall position corresponding to the fourth place, and determines whether any alignment occurs between said first middle point and said second middle point.

8. A method of detecting a mark position, the mark being formed on a semiconductor substrate for misalignment measurement, said method comprising steps of:

acquiring material information on an element constituting the mark;

acquiring shape information on the mark;

irradiating the mark with light;

detecting a reflected beam of light emitted from the mark on irradiation of the light;

acquiring a measured light intensity profile denoting light intensity of said reflected beam according to the shape and the material of the mark on the basis of the detected result of said reflected beam;

preparing a theoretical reflected beam light intensity profile on the basis of said shape information and said material information on the mark, said theoretical reflected beam light intensity profile denoting theoretical light intensity of said reflected beam which would be obtained by irradiating a desired region of the mark with the light;

comparing said measured light intensity profile with said theoretical reflected beam light intensity profile to acquire positional information on a place on a surface of the substrate, the place corresponding to the portion of said measured light intensity profile which is most similar to said theoretical reflected beam light intensity profile; and detecting the position of the mark on the basis of the acquired said positional information.

9. A method of detecting a mark position according to claim 8, wherein said desired region of the mark is a region where intensity of said reflected beam changes.

10. A method of detecting a mark position according to claim 9, wherein said step of acquiring shape information on the mark includes steps of:

diffracting said reflected beam into a ray having an arbitrary wavelength and detecting said diffracted ray in accordance with a surface shape and a material of the mark, recognizing a measured diffracted ray light intensity profile denoting light intensity of said diffracted ray and acquiring said shape information on the mark by analyzing said measured diffracted ray light intensity profile.

11. A method of detecting a mark position according to claim 10, wherein said step of acquiring said shape information includes steps of:

generating a plurality of parameters capable of being candidates to said shape information, preparing a theoretical diffracted ray light intensity profile on the basis of said material information of every parameter, said theoretical diffracted ray light intensity profile being a theoretical light intensity profile of said diffracted ray, comparing said measured diffracted ray light intensity profile with said theoretical diffracted ray light intensity profile of every parameter, selecting said theoretical diffracted ray light intensity profile which is most similar to said measured diffracted ray light intensity profile of said theoretical diffracted ray light intensity profiles, and determining the parameter of said selected theoretical diffracted ray light intensity profile as said shape information.

12. A method of detecting a mark position according to claim 11, wherein the mark includes a first thin film formed of a first material on the substrate and a second thin film formed of a second material on the first film so as to protrude from the first film, the first thin film being provided thereon with a first concavity having a first depth and a second concavity having a second depth, the first concavity and the second concavity being spaced from each other, and, the second thin film being arranged in the middle of the first and second concavities, said shape information includes step information concerning a thickness of the first thin film, a thickness of the second thin film, the first depth and the second depth, said step of preparing theoretical reflected beam light intensity profile is a step of preparing a first through a fourth theoretical reflected beam light intensity profiles, the first theoretical reflected beam light intensity profile corresponding to a first place equivalent to an outside edge of the first concavity in view of the second thin film, the second theoretical reflected beam light intensity profile corresponding to a second place equivalent to an outside edge of the second concavity in view of the second thin film, the third theoretical reflected beam light intensity profile corresponding to a third place equivalent to a first sidewall of the second thin film and the fourth theoretical reflected beam light intensity profile corresponding to a fourth place equivalent to a second sidewall of the second thin film, the second sidewall being faced to the first sidewall, and said step of detecting the position of the mark is a step of calculating a first middle point position which is the middle point of a first edge position corresponding to the first place and a second edge position corresponding to the second place, calculating a second middle point which is the middle point of the first sidewall position corresponding to the third place and the second sidewall position corresponding to the fourth place, and determining whether any alignment occurs between said first middle point and said second middle point.

* * * * *